United States Patent
Choi et al.

(10) Patent No.: US 8,074,599 B2
(45) Date of Patent: Dec. 13, 2011

(54) PLASMA UNIFORMITY CONTROL BY GAS DIFFUSER CURVATURE

(75) Inventors: Soo Young Choi, Fremont, CA (US); Beom Soo Park, San Jose, CA (US); John M. White, Hayward, CA (US); Robin L. Tiner, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1909 days.

(21) Appl. No.: 11/173,210

(22) Filed: Jul. 1, 2005

(65) Prior Publication Data
US 2006/0228496 A1  Oct. 12, 2006

Related U.S. Application Data

(63) Continuation-in-part of application No. 11/021,416, filed on Dec. 22, 2004, now Pat. No. 7,785,672, and a continuation-in-part of application No. 11/143,506, filed on Jun. 2, 2005, now abandoned, and a continuation-in-part of application No. 10/962,936, filed on Oct. 12, 2004, now abandoned, which is a continuation-in-part of application No. 10/889,683, filed on Jul. 12, 2004.

(60) Provisional application No. 60/570,876, filed on May 12, 2004, provisional application No. 60/587,173, filed on Jul. 12, 2004.

(51) Int. Cl.
*C23C 16/455* (2006.01)
*C23F 1/00* (2006.01)
*H01L 21/306* (2006.01)
*C23C 16/22* (2006.01)
*C23C 16/06* (2006.01)

(52) U.S. Cl. .......... 118/723 R; 156/345.33; 156/345.34

(58) Field of Classification Search .......... 118/723 R; 156/345.33, 345.34
See application file for complete search history.

(56) References Cited

U.S. PATENT DOCUMENTS
3,830,194 A   8/1974   Benzing et al.
(Continued)

FOREIGN PATENT DOCUMENTS
CN   1501762   6/2004
(Continued)

OTHER PUBLICATIONS
European Office Action dated Jun. 12, 2008.
(Continued)

*Primary Examiner* — Rudy Zervigon
(74) *Attorney, Agent, or Firm* — Patterson & Sheridan, L.L.P.

(57) ABSTRACT

Embodiments of a gas distribution plate for distributing gas in a processing chamber are provided. In one embodiment, a gas distribution assembly for a plasma processing chamber comprises a diffuser plate with gas passages passing between its upstream and downstream sides and hollow cathode cavities at the downstream side of the gas passages. The downstream side of the diffuser plate has a curvature to improve the thickness uniformity and film property uniformity of thin films deposited by PECVD, particularly SiN and amorphous silicon films. The curvature is preferably described by an arc of a circle or ellipse, the apex thereof located at the center point of the diffuser plate. In one aspect, the hollow cathode cavity volume density, surface area density, or the cavity density of the diffuser increases from the center of the diffuser to the outer edge. Methods for manufacturing such a diffuser plate are also provided.

33 Claims, 15 Drawing Sheets

U.S. PATENT DOCUMENTS

| | | |
|---|---|---|
| 3,854,443 A | 12/1974 | Baerg |
| 4,474,358 A | 10/1984 | Bennett |
| 4,491,520 A | 1/1985 | Jaye et al. |
| 4,522,149 A | 6/1985 | Garbis et al. |
| 4,563,367 A | 1/1986 | Sherman |
| 4,726,924 A | 2/1988 | Mittelstadt |
| 4,763,690 A | 8/1988 | Martin |
| 4,792,378 A | 12/1988 | Rose et al. |
| 4,799,418 A | 1/1989 | Takahashi et al. |
| 4,809,421 A | 3/1989 | Justice |
| 4,854,263 A * | 8/1989 | Chang et al. ............ 118/715 |
| 4,927,991 A | 5/1990 | Wendt et al. |
| 4,993,358 A | 2/1991 | Mahawili |
| 5,000,113 A | 3/1991 | Wang et al. |
| 5,044,943 A | 9/1991 | Bowman et al. |
| 5,124,635 A | 6/1992 | Henley et al. |
| 5,152,504 A | 10/1992 | Nixon et al. |
| 5,173,580 A | 12/1992 | Levin et al. |
| 5,268,034 A | 12/1993 | Vukelic |
| 5,332,443 A | 7/1994 | Chew et al. |
| 5,339,387 A | 8/1994 | Frankel |
| 5,399,387 A | 3/1995 | Law et al. |
| 5,421,893 A | 6/1995 | Perlov |
| 5,439,524 A | 8/1995 | Cain et al. |
| 5,500,256 A | 3/1996 | Watabe |
| 5,503,809 A | 4/1996 | Coate et al. |
| 5,567,243 A | 10/1996 | Foster et al. |
| 5,582,866 A | 12/1996 | White |
| 5,611,865 A | 3/1997 | White et al. |
| 5,614,026 A | 3/1997 | Williams |
| 5,614,055 A | 3/1997 | Fairbairn et al. |
| 5,628,829 A | 5/1997 | Foster et al. |
| 5,628,869 A | 5/1997 | Mallon |
| 5,647,911 A | 7/1997 | Vanell et al. |
| 5,714,408 A | 2/1998 | Ichikawa et al. |
| 5,766,364 A | 6/1998 | Ishida et al. |
| 5,819,434 A | 10/1998 | Herchen et al. |
| 5,820,686 A | 10/1998 | Moore |
| 5,844,205 A | 12/1998 | White et al. |
| 5,846,332 A | 12/1998 | Zhao et al. |
| 5,876,838 A | 3/1999 | Mallon |
| 5,882,411 A | 3/1999 | Zhao et al. |
| 5,928,732 A | 7/1999 | Law et al. |
| 5,950,925 A | 9/1999 | Fukunaga et al. |
| 5,968,276 A | 10/1999 | Lei et al. |
| 5,990,016 A | 11/1999 | Kim et al. |
| 5,994,678 A | 11/1999 | Zhao et al. |
| 5,997,649 A | 12/1999 | Hillman |
| 6,024,799 A | 2/2000 | Chen et al. |
| 6,030,508 A | 2/2000 | Yang et al. |
| 6,040,022 A | 3/2000 | Chang et al. |
| 6,041,733 A | 3/2000 | Kim et al. |
| 6,050,506 A | 4/2000 | Guo et al. |
| 6,079,356 A * | 6/2000 | Umotoy et al. ............ 118/723 E |
| 6,113,700 A | 9/2000 | Choi |
| 6,123,775 A | 9/2000 | Hao et al. |
| 6,140,255 A | 10/2000 | Ngo et al. |
| 6,148,765 A | 11/2000 | Lilleland et al. |
| 6,149,365 A | 11/2000 | White et al. |
| 6,150,283 A | 11/2000 | Ishiguro et al. |
| 6,167,834 B1 | 1/2001 | Wang et al. |
| 6,170,432 B1 | 1/2001 | Szapucki et al. |
| 6,176,668 B1 | 1/2001 | Kurita et al. |
| 6,182,602 B1 | 2/2001 | Redeker et al. |
| 6,182,603 B1 | 2/2001 | Shang et al. |
| 6,197,151 B1 | 3/2001 | Kaji et al. |
| 6,203,622 B1 | 3/2001 | Halpin et al. |
| 6,228,438 B1 | 5/2001 | Schmitt |
| 6,232,218 B1 | 5/2001 | Cathey et al. |
| 6,254,742 B1 | 7/2001 | Hanson et al. |
| 6,281,469 B1 | 8/2001 | Perrin et al. |
| 6,302,057 B1 | 10/2001 | Leusink et al. |
| 6,338,874 B1 | 1/2002 | Law et al. |
| 6,344,420 B1 | 2/2002 | Miyajima et al. |
| 6,364,949 B1 | 4/2002 | Or et al. |
| 6,371,712 B1 | 4/2002 | White et al. |
| 6,383,573 B1 | 5/2002 | Beck et al. |
| 6,444,040 B1 | 9/2002 | Herchen et al. |
| 6,454,855 B1 | 9/2002 | Von Kanel et al. |
| 6,477,980 B1 | 11/2002 | White et al. |
| 6,502,530 B1 | 1/2003 | Turlot et al. |
| 6,527,908 B2 | 3/2003 | Kanetsuki et al. |
| 6,548,112 B1 | 4/2003 | Hillman et al. |
| 6,548,122 B1 | 4/2003 | Sharma et al. |
| 6,556,536 B1 | 4/2003 | Reynolds et al. |
| 6,566,186 B1 | 5/2003 | Allman et al. |
| 6,593,548 B2 | 7/2003 | Matsumura et al. |
| 6,596,576 B2 | 7/2003 | Fu et al. |
| 6,599,367 B1 | 7/2003 | Nakatsuka |
| 6,616,766 B2 | 9/2003 | Dunham |
| 6,619,131 B2 | 9/2003 | Walchli et al. |
| 6,626,988 B1 | 9/2003 | Schmalstieg et al. |
| 6,626,998 B1 | 9/2003 | Dunham |
| 6,631,692 B1 | 10/2003 | Matsuki et al. |
| 6,663,025 B1 | 12/2003 | Halsey et al. |
| 6,664,202 B2 | 12/2003 | Tang et al. |
| 6,682,630 B1 | 1/2004 | Colpo et al. |
| 6,683,216 B1 | 1/2004 | Zoeller et al. |
| 6,740,367 B2 | 5/2004 | Matsuki et al. |
| 6,756,324 B1 | 6/2004 | Gates |
| 6,772,827 B2 | 8/2004 | Keller et al. |
| 6,793,733 B2 | 9/2004 | Janakiraman et al. |
| 6,814,838 B2 | 11/2004 | Weichart |
| 6,821,347 B2 | 11/2004 | Carpenter et al. |
| 6,852,168 B2 | 2/2005 | Park |
| 6,860,965 B1 | 3/2005 | Stevens |
| 6,873,764 B2 | 3/2005 | Maisenholder et al. |
| 6,881,684 B2 | 4/2005 | Aota et al. |
| 6,916,407 B2 | 7/2005 | Voser et al. |
| 6,918,352 B2 | 7/2005 | Von Kanel et al. |
| 6,924,241 B2 | 8/2005 | Lee |
| 6,942,753 B2 | 9/2005 | Choi et al. |
| 6,961,490 B2 | 11/2005 | Maisenholder et al. |
| 7,125,758 B2 | 10/2006 | Choi et al. |
| 2001/0021422 A1 | 9/2001 | Yamakoshi et al. |
| 2001/0023742 A1 | 9/2001 | Schmitt |
| 2001/0029892 A1 | 10/2001 | Cook et al. |
| 2002/0006478 A1 | 1/2002 | Yuda et al. |
| 2002/0011215 A1 | 1/2002 | Tei et al. |
| 2002/0129769 A1 | 9/2002 | Kim et al. |
| 2002/0134309 A1 | 9/2002 | Tu et al. |
| 2002/0146879 A1 | 10/2002 | Fu et al. |
| 2002/0174950 A1 | 11/2002 | Park |
| 2002/0189545 A1 | 12/2002 | Matsumura et al. |
| 2003/0089314 A1 | 5/2003 | Matsuki et al. |
| 2003/0143410 A1 | 7/2003 | Won et al. |
| 2003/0170388 A1 | 9/2003 | Shinriki et al. |
| 2003/0199175 A1 | 10/2003 | Tang et al. |
| 2003/0209323 A1 | 11/2003 | Yokogaki |
| 2004/0003777 A1 | 1/2004 | Carpenter et al. |
| 2004/0043637 A1 | 3/2004 | Aota et al. |
| 2004/0064407 A1 | 4/2004 | Kight et al. |
| 2004/0129211 A1 | 7/2004 | Blonigan et al. |
| 2004/0145383 A1 | 7/2004 | Brunner |
| 2004/0228141 A1 | 11/2004 | Hay et al. |
| 2004/0250955 A1 | 12/2004 | Blonigan et al. |
| 2005/0000430 A1 | 1/2005 | Jang et al. |
| 2005/0066898 A1 | 3/2005 | Schmitt et al. |
| 2005/0133160 A1 | 6/2005 | Kennedy et al. |
| 2005/0133161 A1 | 6/2005 | Carpenter et al. |
| 2005/0183827 A1 | 8/2005 | White et al. |
| 2005/0196254 A1 | 9/2005 | Kim et al. |
| 2005/0199182 A1 | 9/2005 | Masuda et al. |
| 2005/0223986 A1 | 10/2005 | Choi et al. |
| 2005/0251990 A1 | 11/2005 | Choi et al. |
| 2005/0255257 A1 | 11/2005 | Choi et al. |
| 2006/0005771 A1 | 1/2006 | White et al. |
| 2006/0005926 A1 | 1/2006 | Kang |
| 2006/0054280 A1 | 3/2006 | Jang |
| 2006/0060138 A1 | 3/2006 | Keller et al. |
| 2006/0130764 A1 | 6/2006 | Quan |
| 2006/0228496 A1 | 10/2006 | Choi et al. |
| 2006/0236934 A1 | 10/2006 | Choi et al. |

FOREIGN PATENT DOCUMENTS

| | | |
|---|---|---|
| EP | 0843348 | 5/1998 |
| EP | 0985742 | 3/2000 |

| | | |
|---|---|---|
| EP | 1118693 | 7/2001 |
| EP | 1167570 | 1/2002 |
| EP | 1168427 | 1/2002 |
| EP | 1286386 | 2/2003 |
| EP | 1321538 | 6/2003 |
| EP | 1386981 | 2/2004 |
| EP | 1693880 | 8/2006 |
| JP | 60-025235 | 2/1985 |
| JP | 01/004481 A | 6/1987 |
| JP | 63-187619 | 8/1988 |
| JP | 01004481 | 1/1989 |
| JP | 01149964 | 6/1989 |
| JP | 01149964 A2 | 6/1989 |
| JP | 03-122281 | 5/1991 |
| JP | 03122285 | 5/1991 |
| JP | 08-055802 | 2/1996 |
| JP | 08-070035 | 3/1996 |
| JP | 2000-269146 | 9/2000 |
| JP | 2001102309 | 4/2001 |
| JP | 2001-164371 | 6/2001 |
| JP | 2001-284271 | 10/2001 |
| JP | 2002-064084 | 2/2002 |
| JP | 2003-179037 | 6/2003 |
| JP | 2004-055895 | 2/2004 |
| JP | 2005-086208 | 3/2005 |
| JP | 2006-121057 | 5/2006 |
| KR | 1998-0032712 | 9/1998 |
| KR | 0189495 | 7/2000 |
| KR | 10-2001-0044503 | 6/2001 |
| KR | 20010077810 | 8/2001 |
| KR | 10-2003-0009853 | 2/2003 |
| KR | 10-2003-0042920 | 6/2003 |
| KR | 10-2003-0066118 | 8/2003 |
| KR | 10-2003-0077803 | 10/2003 |
| KR | 10-2004-0011910 | 2/2004 |
| KR | 10-2004-0019109 | 3/2004 |
| KR | 10-2004-0066005 | 7/2004 |
| KR | 10-2004-0100196 | 12/2004 |
| KR | 10-2004-0104197 | 12/2004 |
| KR | 10-2005-0015931 | 2/2005 |
| KR | 10-2005-0076070 | 7/2005 |
| KR | 10-2005-0080105 | 8/2005 |
| KR | 200587454 | 8/2005 |
| KR | 10-2006-0004505 | 1/2006 |
| KR | 10-2006-0045322 | 5/2006 |
| KR | 10592682 | 6/2006 |
| KR | 2007-0039931 A | 4/2007 |
| TW | 301465 | 11/2002 |
| TW | 239225 | 9/2005 |
| TW | 252223 | 4/2006 |
| TW | I276701 B | 3/2007 |
| TW | 279997 | 4/2007 |
| WO | WO 95/33866 | 12/1995 |
| WO | WO 99/25012 | 5/1999 |
| WO | WO 99/25895 | 5/1999 |
| WO | WO 01/83852 | 11/2001 |
| WO | WO-03002860 | 1/2003 |
| WO | WO 03/015481 | 2/2003 |
| WO | WO 03/078681 | 9/2003 |
| WO | WO 2004/064407 | 7/2004 |
| WO | WO 2005/106917 | 11/2005 |

OTHER PUBLICATIONS

"13.56 MHz Hollow Cathode Plasma Source HCD-P 100" Plasma Consult Germany—Technical Note.
"13.56 MHz Hollow Cathode Plasma Source HCD-P 300" Plasma Consult Germany—Technical Note.
Anders, et al. "Characterization of Low-Energy Constricted-Plasma Source," Ernest Orlando Lawrence Berkeley National Laboratory & Institute of Physics, Germany (Aug. 1997), pp. 1-11.
Anders, et al. "Working Principle of the Hollow-Anode Plasma Source," Lawrence Berkeley National Laboratory, USB, pp. 1-10.
Bardos, et al. "Thin Film Processing By Radio Frequency Hollow Cathodes," Surface and Coatings Technology (1997), pp. 723-728.
Chinese Office Action dated Jun. 15, 2007 for Chinese Application No. 200410082199.3.
European Office Action dated Dec. 20, 2007 for European Patent Application No. 05000831.7.
European Office Action dated Feb. 23, 2007 for European Application No. 05000831.7-1215.
European Partial Search Report dated May 23, 2006 for European Application No. 05021902.1.
European Search Report dated Feb. 16, 2006 for European Application No. 05000831.7-2122.
Extended European Search Report dated Aug. 24, 2006 for European Application No. 05021902.1.
International Search Report and Written Opinion dated Jul. 19, 2006 for International Application No. PCT/US2005/24165.
International Search Report mailed Aug. 11, 2005 for International Application No. PCT/US05/12832.
Kim et al. "A Novel Self-Aligned Coplanar Amorphous Silicon Thin Film Transistor," ISSN0098-0966X/98/2901 (1998).
Korean Office Action dated Nov. 22, 2007 for Korean Patent Application No. 10-2007-0079040.
Kyung-ha "A Study on Laser Annealed Polycrystalline Silicon Thin Film Transistors (TFTs) with SiNx Gate Insulator," Kyung Hee University, Ch. 2 & 4 (1998).
Lieberman et al. "Standing wave and skin effects in large-area, high-frequency capacitive discharges," Plasma Sources Sci. Technolo., vol. 11, pp. 283-293 (2002).
Sazonov et al. "Low Temperature a-Si:H TFT on Plastic Films: Materials and Fabrication Aspects," Proc. 23rd International Conference on Microelectronics (MIEL 2002), vol. 2, Nis, Yugosolvia (May 12-15, 2002).
Taiwan Search Report dated Apr. 5, 2007 for Taiwanese Patent Application No. TW 94130602.
Third Party Submission dated Nov. 2006 for Korean Application No. KR 10-2004-0108843.
Thomasson et al. "High Mobility Tri-Layer a-Si:H Thin Film Transistors with Ultra-Thin Active Layer," IEEE Electron Device Letters, vol. 18, No. 8, Aug. 1997, pp. 397-399.
PCT/US2005/024165 International Search Report, published Jul. 7, 2005.
S. K. Kim et al., "A Novel Self-Aligned Coplanar Amorphous Silicon Thin Film Transistor", ISSN0098-0966X/98/2901 (1998).
L. Kyung-ha, "A Study on Laser Annealed Polycrystalline Silicon Thin Film Transistors (TFTs) with SiNx Gate Insulator", Kyung Hee University, Ch. 2 & 4 (1998).
M. A. Lieberman et al., "Standing wave and skin effects in large-area, high-frequency capacitive discharges", Plasma Sources Sci. Technol., vol. 11, pp. 216 (2002).
M. A. Lieberman et al., "Standing wave and skin effects in large-area, high-frequency capacitive discharges", Plasma Sources Sci. Technol., vol. 11, pp. 283-293 (2002).
Y. Park, "Bulk and interface properties of low-temperature silicon nitride films deposited by remote plasma enhanced chemical vapor deposition", Journal of Materials Science: Materials in Electronics, vol. 12, pp. 515-522 (2001).
A. Sazonov et al., "Low Temperature a-Si:H TFT on Plastic Films: Materials and Fabrication Aspects", Proc. 23$^{rd}$ International Conference on Microelectronics (MIEL 2002), vol. 2, Nis, Yugoslavia (May 2002).
Yue Kuo, "Plasma Enhanced Chemical Vapor Deposited Silicon Nitride as a Gate Dielectric Film for Amorphous Silicon Thin Film Transistors—A Critical Review", Vacuum, vol. 51, No. 4, pp. 741-745, Elsevier Science, Ltd., Pergamon Press, Great Britain, Dec. 1998.
D. B. Thomasson et al., "High Mobility Tri-Layer a-Si:H Thin Film Transistors with Ultra-Thin Active Layer", 1997 Society for Information Display International Symposium Digest of Technical Papers, vol. 28, pp. 176-179 (May 1997).
Chinese Office Action dated Jul. 27, 2007 for Chinese Application No. 200510106396.9.
Chinese Office Action dated Jun. 6, 2008 for Chinese Application No. 200510106396.9.
Decision of Patent Examination and Allowance dated Nov. 30, 2007 for Korean Application No. 10-2005-87454.
Examiner's Grounds for Rejection dated May 25, 2007 for Korean Application No. 10-2005-87454.
Examiner's Grounds for Rejection dated Sep. 9, 2008 for Korean Application No. 10-2007-0079040.

European Office Action dated Jun. 12, 2008 for European Application No. 05764564.0.
Japanese Notice of Reasons for Rejection dated Jul. 8, 2008 for Japanese Application No. 2004-353175.
Korean Notice of Preliminary Rejection dated May 7, 2007 for Korean Application No. 10-2004-0108843.
Korean Office Action dated Aug. 29, 2006 for Korean Application No. 10-2004-0108843.
Korean Office Action dated Oct. 31, 2006 for Korean Application No. 10-2005-87454.
Lee, et al. "High Density Hollow Cathode Plasma Etching for Field Emission Display Applications", Journal of Information Display, vol. 2, No. 4, (2001), pp. 1-7.
Official Letter dated Jan. 27, 2005 for Taiwan Application No. 93136349.
Partial Search Report dated Mar. 15, 2006 for International Application No. PCT/US2005/024165.
Office Action dated Feb. 24, 2009 for European Patent Application No. 05000831.7-1215.
Notice of Reasons for Rejection dated Feb. 17, 2009 for Japanese Patent Application No. 2005-272673.
Office Action dated Dec. 19, 2008 for Chinese Patent Application No. 200580022984.2.
Notice to File a Response for Korean Patent Application No. 10-2008-0053726 dated May 18, 2010.
Taiwan Office Action for application No. 097121591 dated Mar. 24, 2011.
Chinese office action dated Nov. 3, 2010 for Chinese Patent Application No. 200710166935.7.
Korean office action dated Dec. 10, 2010 for Korean patent application No. 10-2008-0053726.
Taiwan Office Action for Application No. 95119776, dated Mar. 10, 2011.

* cited by examiner

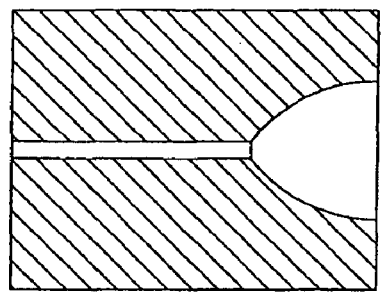
FIG. 6B
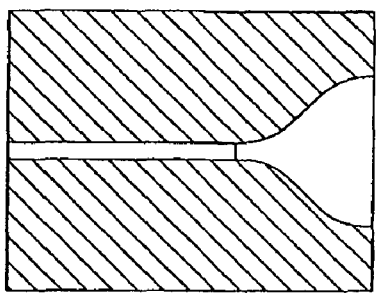
FIG. 6C
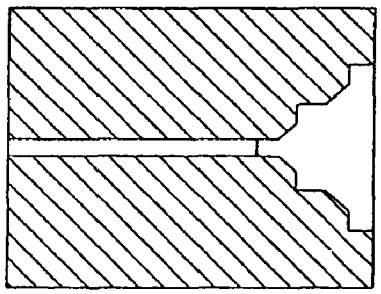
FIG. 6D
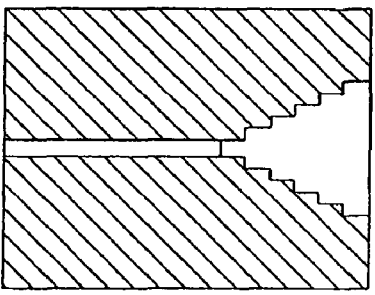
FIG. 6E
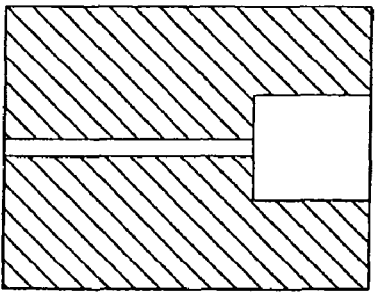
FIG. 6F
FIG. 6G

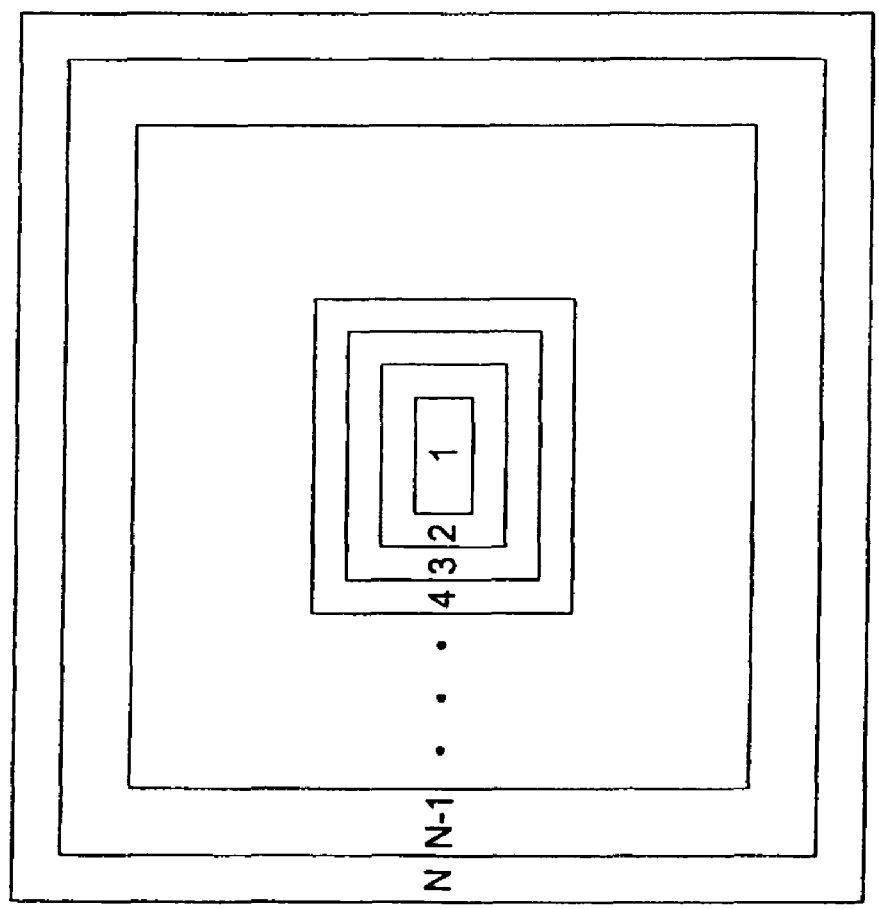

PLASMA UNIFORMITY CONTROL BY GAS DIFFUSER CURVATURE

This application claims benefit to U.S. provisional patent application Ser. No. 60/587,173, filed Jul. 12, 2004. The disclosure of the aforementioned related patent application is herein incorporated by reference in its entirety to the extent not inconsistent with the claimed invention.

This application is a continuation-in-part of U.S. patent application Ser. No. 11/021,416, filed Dec. 22, 2004 now U.S. Pat. No. 7,785,672. This application is a continuation-in-part of U.S. patent application Ser. No. 11/143,506, filed Jun. 2, 2005 now abandoned. This application is a continuation-in-part of U.S. patent application Ser. No. 10/962,936, filed Oct. 12, 2004 now abandoned. This application is a continuation-in-part of U.S. patent application Ser. No. 10/889,683, filed Jul. 12, 2004, which claims benefit of U.S. provisional patent application Ser. No. 60/570,876, filed May 12, 2004. The disclosure of each of the aforementioned related patent applications is herein incorporated by reference in its entirety not inconsistent with the claimed invention.

BACKGROUND OF THE DISCLOSURE

1. Field of the Invention

Embodiments of the invention generally relate to a gas distribution plate assembly and method for distributing gas in a processing chamber.

2. Description of the Related Art

Liquid crystal displays or flat panels are commonly used for active matrix displays such as computer and television monitors. Plasma enhanced chemical vapor deposition (PECVD) is generally employed to deposit thin films on a substrate such as a transparent substrate for flat panel display or semiconductor wafer. PECVD is generally accomplished by introducing a precursor gas or gas mixture into a vacuum chamber that contains a substrate. The precursor gas or gas mixture is typically directed downwardly through a distribution plate situated near the top of the chamber. The precursor gas or gas mixture in the chamber is energized (e.g., excited) into a plasma by applying radio frequency (RF) power to the chamber from one or more RF sources coupled to the chamber. The excited gas or gas mixture reacts to form a layer of material on a surface of the substrate that is positioned on a temperature controlled substrate support. Volatile by-products produced during the reaction are pumped from the chamber through an exhaust system.

Flat panels processed by PECVD techniques are typically large, often exceeding 370 mm×470 mm. Large area substrates approaching and exceeding 4 square meters are envisioned in the near future. Gas distribution plates (or gas diffuser plates) utilized to provide uniform process gas flow over flat panels are relatively large in size, particularly as compared to gas distribution plates utilized for 200 mm and 300 mm semiconductor wafer processing.

As the size of substrates continues to grow in the TFT-LCD industry, film thickness and film property uniformity control for large area plasma-enhanced chemical vapor deposition (PECVD) becomes an issue. TFT is one type of flat panel display. The difference of deposition rate and/or film property, such as film stress, between the center and the edge of the substrate becomes significant.

FIG. 1 illustrates a cross-sectional schematic view of a thin film transistor structure. A common TFT structure is the back channel etch (BCE) inverted staggered (or bottom gate) TFT structure shown in FIG. 1. The BCE process is preferred, because the gate dielectric (silicon nitride), and the intrinsic as well as n+ doped amorphous silicon films can be deposited in the same PECVD pump-down run. The BCE process shown here involves only 5 patterning masks. The substrate 101 may comprise a material that is essentially optically transparent in the visible spectrum, such as, for example, glass or clear plastic. The substrate may be of varying shapes or dimensions. Typically, for TFT applications, the substrate is a glass substrate with a surface area greater than about 500 mm$^2$. A gate electrode layer 102 is formed on the substrate 101. The gate electrode layer 102 comprises an electrically conductive layer that controls the movement of charge carriers within the TFT. The gate electrode layer 102 may comprise a metal such as, for example, aluminum (Al), tungsten (W), chromium (Cr), tantalum (Ta), or combinations thereof, among others. The gate electrode layer 102 may be formed using conventional deposition, lithography and etching techniques. Between the substrate 101 and the gate electrode layer 102, there may be an optional insulating material, for example, such as silicon dioxide ($SiO_2$) or silicon nitride (SiN), which may also be formed using an embodiment of a PECVD system described herein. The gate electrode layer 102 is then lithographically patterned and etched using conventional techniques to define the gate electrode.

A gate dielectric layer 103 is formed on the gate electrode layer 102. The gate dielectric layer 103 may be silicon dioxide ($SiO_2$), silicon oxynitride (SiON), or SiN, deposited using an embodiment of a PECVD system described in this invention. The gate dielectric layer 103 may be formed to a thickness in the range of about 100 Å to about 6000 Å.

A bulk semiconductor layer 104 is formed on the gate dielectric layer 103. The bulk semiconductor layer 104 may comprise polycrystalline silicon (polysilicon) or amorphous silicon ($\alpha$-Si), which could be deposited using an embodiment of a PECVD system described herein or other conventional methods known to the art. Bulk semiconductor layer 104 may be deposited to a thickness in the range of about 100 Å to about 3000 Å. A doped semiconductor layer 105 is formed on top of the semiconductor layer 104. The doped semiconductor layer 105 may comprise n-type (n+) or p-type (p+) doped polycrystalline (polysilicon) or amorphous silicon ($\alpha$-Si), which could be deposited using an embodiment of a PECVD system described herein or other conventional methods known to the art. Doped semiconductor layer 105 may be deposited to a thickness within a range of about 100 Å to about 3000 Å. An example of the doped semiconductor layer 105 is n+ doped $\alpha$-Si film. The bulk semiconductor layer 104 and the doped semiconductor layer 105 are lithographically patterned and etched using conventional techniques to define a mesa of these two films over the gate dielectric insulator, which also serves as storage capacitor dielectric. The doped semiconductor layer 105 directly contacts portions of the bulk semiconductor layer 104, forming a semiconductor junction.

A conductive layer 106 is then deposited on the exposed surface. The conductive layer 106 may comprise a metal such as, for example, aluminum (Al), tungsten (W), molybdenum (Mo), chromium (Cr), tantalum (Ta), and combinations thereof, among others. The conductive layer 106 may be formed using conventional deposition techniques. Both the conductive layer 106 and the doped semiconductor layer 105 may be lithographically patterned to define source and drain contacts of the TFT. Afterwards, a passivation layer 107 may be deposited. Passivation layer 107 conformably coats exposed surfaces. The passivation layer 107 is generally an insulator and may comprise, for example, $SiO_2$ or SiN. The passivation layer 107 may be formed using, for example, PECVD or other conventional methods known to the art. The passivation layer 107 may be deposited to a thickness in the range of about 1000 Å to about 5000 Å. The passivation layer 107 is then lithographically patterned and etched using conventional techniques to open contact holes in the passivation layer.

A transparent conductor layer 108 is then deposited and patterned to make contacts with the conductive layer 106. The transparent conductor layer 108 comprises a material that is essentially optically transparent in the visible spectrum and is electrically conductive. Transparent conductor layer 108 may comprise, for example, indium tin oxide (ITO) or zinc oxide, among others. Patterning of the transparent conductive layer 108 is accomplished by conventional lithographical and etching techniques.

The doped or un-doped (intrinsic) amorphous silicon ($\alpha$-Si), $SiO_2$, SiON and SiN films used in liquid crystal displays (or flat panels) may all be deposited using an embodiment of a plasma enhanced chemical vapor deposition (PECVD) system described in this invention. The TFT structure described here is merely used as an example.

As the size of substrates continues to grow in the TFT-LCD industry, especially when the substrate size is at least about 1000 mm by about 1200 mm (or about 1,200,000 $mm^2$), film thickness and property uniformity for large area plasma-enhanced chemical vapor deposition (PECVD) becomes more problematic. Examples of noticeable uniformity problems include higher deposition rates and more compressive films in the central area of large substrates for some high deposition rate SiN and $\alpha$-Si films. The thickness uniformity across the substrate appears "dome shaped", or "center thick", with the film in the center region thicker than the edge region. Larger substrates have worse center thick uniformity issues.

Therefore, there is a need for an improved gas distribution plate assembly that improves the uniformity of film deposition thickness and film properties for thin films, particularly SiN and $\alpha$-Si, that are deposited on large substrates in PECVD chambers.

SUMMARY OF THE INVENTION

Embodiments of a gas distribution plate for distributing gas in a processing chamber are provided. In one embodiment, a gas distribution plate assembly for a plasma processing chamber comprises a diffuser plate having an upstream side and a downstream side, gas passages passing between the upstream and downstream sides of the diffuser plate and hollow cathode cavities at the downstream side of the gas passages. The downstream side of the diffuser plate has a curvature to improve the thickness uniformity and film property uniformity of thin films deposited by PECVD. In one aspect, either the hollow cathode cavity volume density, hollow cathode cavity surface area density, or the cathode cavity density of the diffuser increases from the center of the diffuser to the edge of the diffuser. In another aspect, the downstream side of the gas diffuser plate is divided into a number of concentric zones, wherein the gas passages in each zone are identical and the density, volume, or surface area of hollow cathode cavities of gas passages in each zone gradually increases from the center to the edge of the diffuser plate.

In another embodiment, a plasma processing chamber comprises a diffuser plate having an upstream side and a downstream side, gas passages passing between the upstream and downstream sides of the diffuser plate and hollow cathode cavities at the downstream side of the gas passages. The down-stream side of the diffuser plate has a curvature to improve the thickness uniformity and film property uniformity of thin films deposited by PECVD. In one aspect, either the hollow cathode cavity volume density, hollow cathode cavity surface area density, or the cathode cavity density of the diffuser increases from the center of the diffuser to the edge of the diffuser.

In another embodiment, a method of making a gas diffuser plate for a plasma processing chamber comprises softening a diffuser plate by heating, bending the diffuser plate to a curvature with a curvature annealing fixture and machining gas passages into the diffuser plate.

In another embodiment, a method of making a diffuser plate for a plasma processing chamber comprises machining a curvature into a substantially flat diffuser plate and machining gas passages into the diffuser plate.

In another embodiment, a method of depositing a thin film on a substrate comprises placing a substrate in a process chamber with a gas diffuser plate having a curvature, an upstream side and a downstream side, gas passages passing between the upstream and downstream sides of the diffuser plate and hollow cathode cavities at the downstream side of the gas passages, flowing process gas(es) through a diffuser plate toward a substrate supported on a substrate support, creating a plasma between the diffuser plate and the substrate support, and depositing a thin film on the substrate in the process chamber. In one aspect, either the hollow cathode cavity volume density, or the hollow cathode cavity surface area density, or the hollow cathode cavity density of the gas passages at the center of the diffuser plate are less than the same parameter of the gas passages at the edge of the diffuser plate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 6B-6G illustrate various designs of hollow cathode cavities.

FIG. 9A shows a diffuser plate with diffuser holes in multiple zones.

For clarity, identical reference numerals have been used, where applicable, to designate identical elements that are common between figures.

DETAILED DESCRIPTION

The invention generally provides a gas distribution assembly for providing gas delivery within a processing chamber. The invention is illustratively described below in reference to a plasma enhanced chemical vapor deposition system configured to process large area substrates, such as a plasma enhanced chemical vapor deposition (PECVD) system, available from AKT, a division of Applied Materials, Inc., Santa Clara, Calif. However, it should be understood that the invention has utility in other system configurations such as etch systems, other chemical vapor deposition systems and any other system in which distributing gas within a process chamber is desired, including those systems configured to process round substrates.

For SiN films, the center thick uniformity problem has been solved by varying the size and/or distribution of cathode cavities on the downstream surface of a PECVD gas diffuser plate. The cathode cavities enhance plasma ionization in the PECVD chamber. Because SiN film thickness and film property uniformity are strongly dependent on local plasma density in a PECVD chamber, varying the depths, diameters, surface area and/or density of hollow cathode cavities across the surface of a diffuser plate can eliminate the center thick uniformity problem for large substrates. This technique is known as the hollow cathode gradient, or HCG, method and is described in more detail below in conjunction with FIGS. 6A, 8 and 8. A complete description of the HCG method is provided in previously referenced U.S. patent application Ser. No. 10/889,683, entitled "Plasma Uniformity Control By Gas Diffuser Hole Design," filed Jul. 12, 2004 by Choi, et al.

Figure 1:
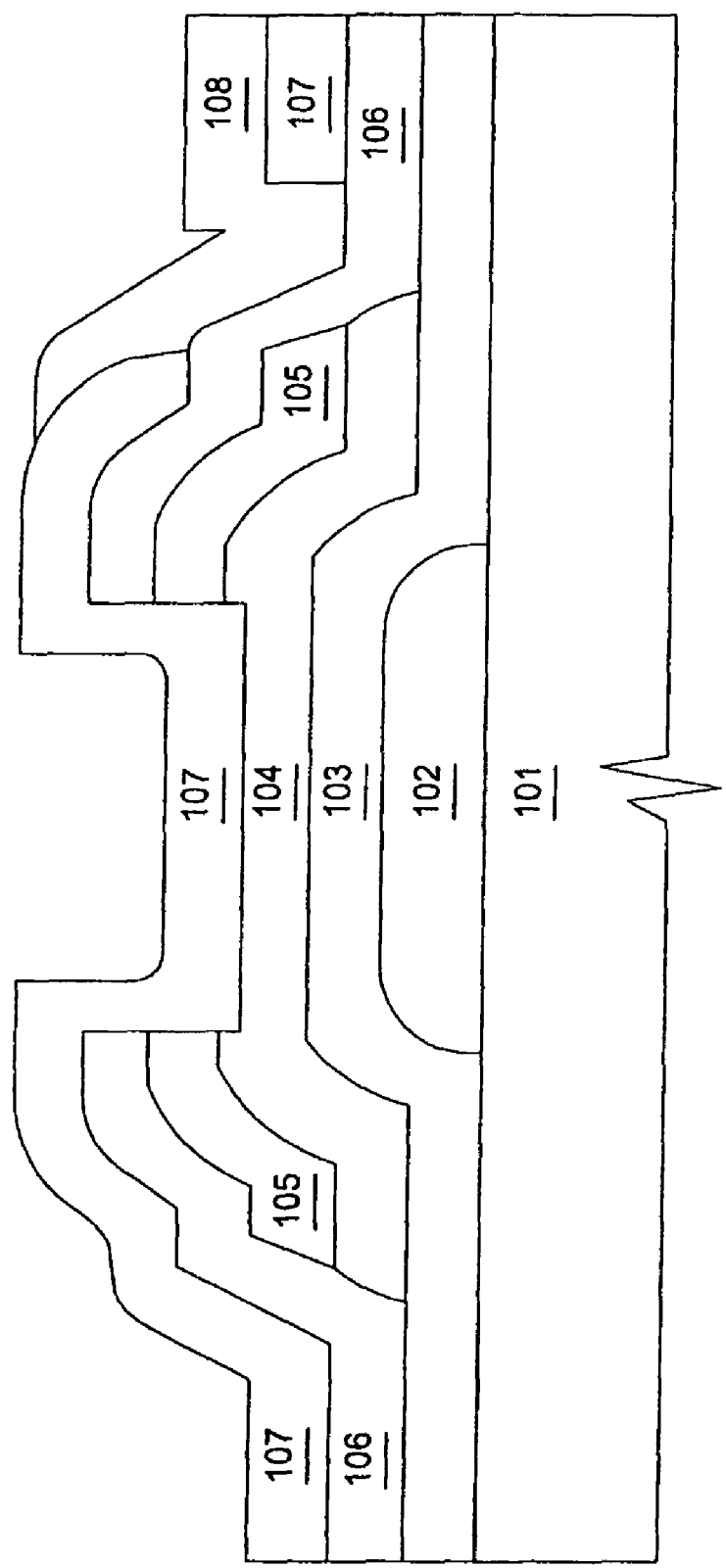
FIG. 1 illustrates a cross-sectional schematic view of a thin film transistor structure.
Figure 2:
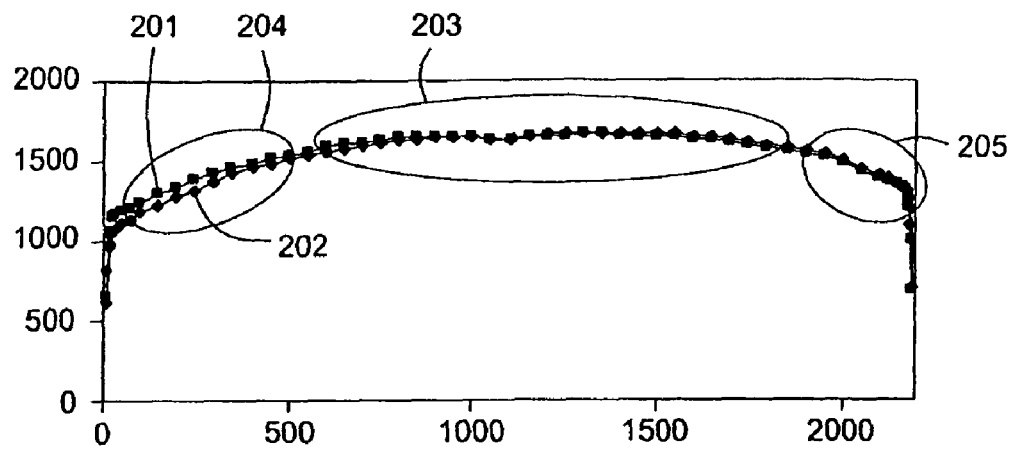
FIG. 2 shows thickness profiles of an amorphous silicon film across a 2200 mm wide glass substrate.

For α-Si films, the thickness uniformity is still a problem for substrates larger in size than 1,200,000 mm². "Substrate size" and "diffuser plate size" as used herein refer to the nominal surface area, or footprint, of a substrate or diffuser plate and not to the wetted surface area, i.e., the total surface area of all sides and surfaces combined. For example, a 1,000 mm×1,000 mm diffuser plate has a nominal size of 1,000,000 mm², but a much higher wetted surface area, which includes the top and bottom surfaces, side edges, and all features machined into the surface of the diffuser. FIG. 2 shows thickness profiles of an amorphous silicon film across a 2200 mm wide glass substrate. The abscissa represents the position, in millimeters, of each thickness measurement along the profile of the 2200 mm long substrate. The ordinate represents the deposition rate, in Å/min, of the amorphous silicon film deposited on the substrate. Two data sets are illustrated in FIG. 2, data set 201 by squares, data set 202 by diamonds. Data sets 201 and 202 represent the deposition rate profile measured along each diagonal of the substrate. As can be seen in FIG. 2, there is no significant difference between the two profiles, so it is assumed that the center thick profile exhibited by data sets 201 and 202 is relatively constant across the length of the diffuser.

Figure 3:
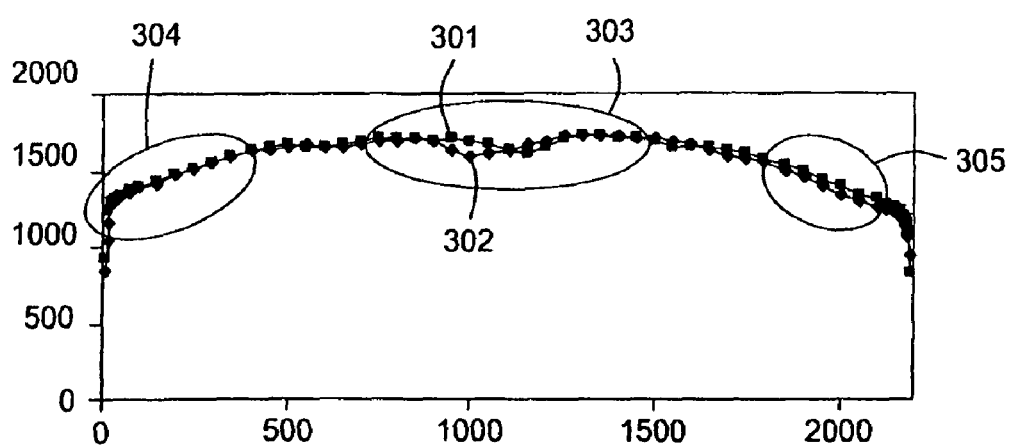
FIG. 3 shows thickness profiles of another amorphous silicon film across a 2200 mm wide glass substrate.
Figure 4:
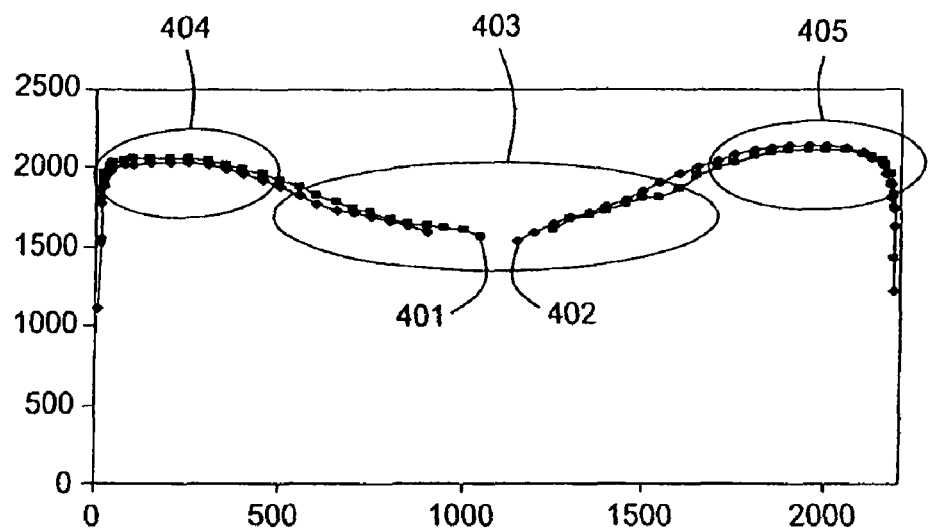
FIG. 4 shows thickness profiles of another amorphous silicon film across a 2200 mm wide glass substrate.

A gas diffuser plate incorporating HCG was used to deposit the α-Si film measured for data sets 201 and 202. The electrode spacing, i.e., the distance between the gas diffuser plate and the substrate support in the PECVD chamber, was 0.800 inches while depositing the film. Process conditions during deposition of the film were: 10,000 sccm $SiH_4$ gas flow rate, 40,000 sccm $H_2$ gas flow rate, 11,000 W RF plasma power, chamber pressure of 2.7 Torr and substrate temperature of 340 C (inner substrate heater) and 360 C (outer substrate heater). The components of a PECVD chamber, including the gas diffuser plate, substrate support, and electrode spacing, are described in greater detail in conjunction with FIG. 5. Other silicon-containing gases than $SiH_4$ may be used for the deposition of α-Si films in a PECVD chamber, such as $Si_2H_6$. Referring back to FIG. 2, despite the use of a gas diffuser plate incorporating HCG, film thickness uniformity of the amorphous silicon film still suffers from the center thick effect—with poor uniformity and film properties at the edge of the substrate. The substrate center region 203 of the film uniformity profile indicates acceptable film properties and uniformity while edge regions 204 and 205 show poor uniformity and film properties. It has been shown that HCG does have some effect on At narrower electrode spacings, the thickness uniformity of amorphous silicon films improves at the edge, but this is off-set by poor film uniformity at the center of large substrates. FIGS. 3 and 4 show thickness profiles of an amorphous silicon film across a 2200 mm wide glass substrate with electrode spacings of 0.650 and 0.550 inches, respectively. In FIG. 3, film thickness profiles 301 and 302 show deterioration in uniformity in substrate center region 303 and a slight improvement in thickness uniformity in edge regions 304 and 305. Except for the narrower electrode spacing of 0.650 inches, the α-Si film measured for FIG. 3 was deposited in an identical PECVD chamber and under the same process conditions as the α-Si film measured for FIG. 2. FIG. 4 illustrates film thickness profiles 401 and 402 for an α-Si film deposited under identical process conditions as the films of FIGS. 2 and 3, except with an electrode spacing of 0.550 inches. Film thickness profiles 401 and 402 show further uniformity deterioration in center region 403 and greatly improved thickness uniformity in edge regions 404 and 405. Hence, the data shown in FIGS. 2, 3 and 4 indicate that electrode spacing more strongly effects α-Si film uniformity than the hollow cathode gradient effect.

As can be seen from FIGS. 2, 3, and 4, when depositing α-Si films on large substrates, film thickness uniformity issues may be altered but not eliminated by using an HCG gas diffuser plate at varying electrode spacings. In general, narrower electrode spacing improves edge thickness uniformity and wider spacing improves the center thickness uniformity. But there is no single electrode spacing with these process conditions that allows acceptable thickness uniformity at the center and edge regions of the α-Si film.

It may be possible to tune other process parameters besides electrode spacing in order to achieve acceptable thickness uniformity of α-Si films with an HCG gas diffuser plate. However, a serious disadvantage of this approach is the necessity of relying on a small process window to produce acceptable α-Si films. A process window is the range of variation for all process parameters, such as substrate temperature or gas flow rate, that still produces acceptable results. With a narrow process window, small—and sometimes undetectable—variations in the process parameters can lead to large changes in the final product. These variations may be the random fluctuations that are always present during substrate processing or gradual, long-term drift over time as process chamber components wear out or measuring devices lose accuracy. This means that the same process parameter settings that produce acceptable films with one PECVD chamber may not work on a nominally identical PECVD chamber and the process parameters may need to be fine-tuned for each chamber. Alternately, a PECVD chamber that is depositing acceptable films on substrates is more likely to begin depositing unacceptable films over time when process parameters must operate inside a small process window. Hence, this method is not practical for large-scale processing of substrates. Therefore, use of a gas diffuser plate with HCG alone cannot solve the thickness uniformity issues typical of films deposited on large substrates for both SiN and α-Si films.

Exemplary PECVD Chamber

Figure 5:
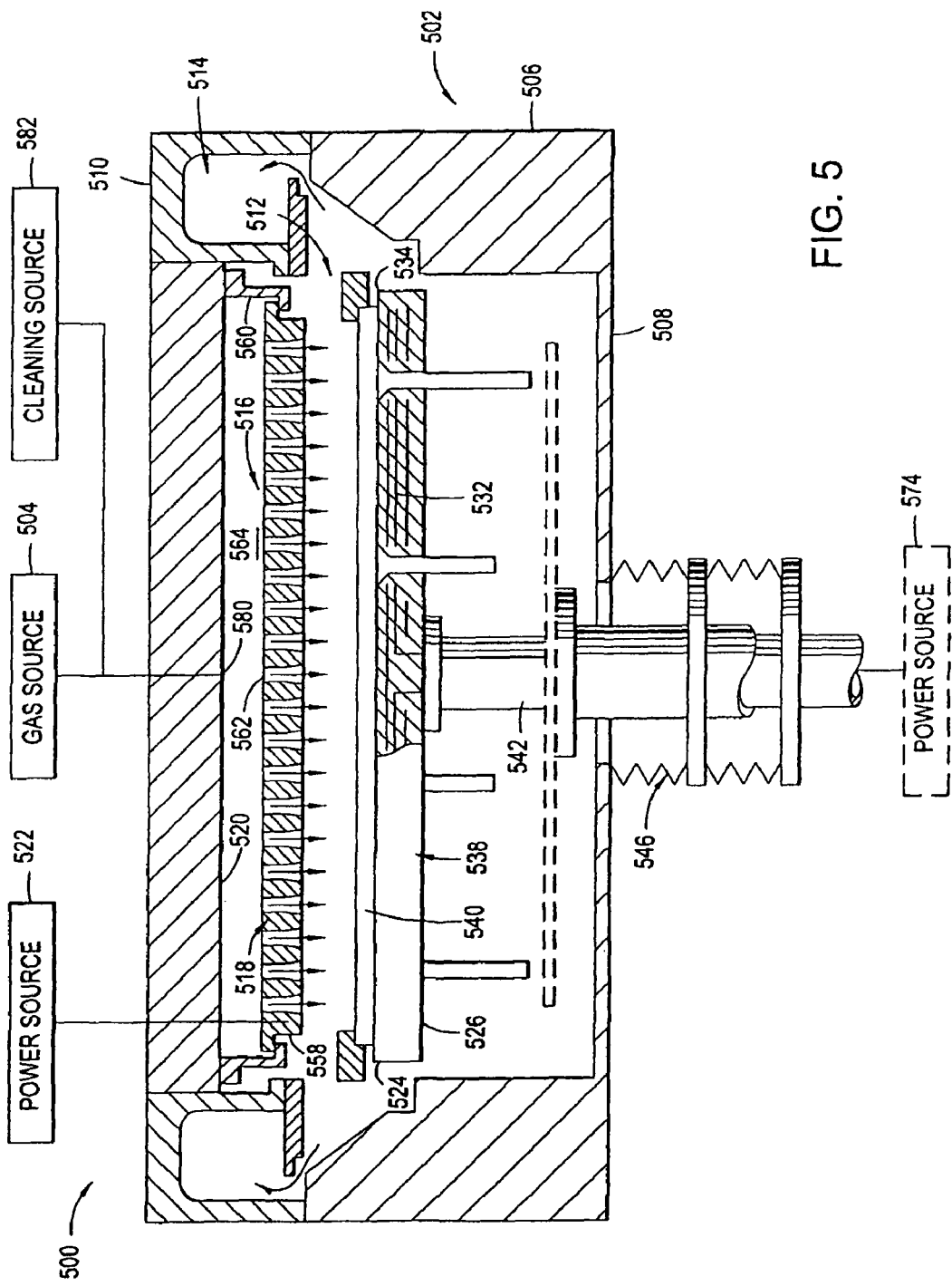
FIG. 5 is a schematic cross-sectional view of one embodiment of a plasma enhanced chemical vapor deposition system.

FIG. 5 is a schematic cross-sectional view of a plasma enhanced chemical vapor deposition system 500 that may be adapted to benefit from the invention. PECVD system 500 is available from AKT, a division of Applied Materials, Inc., Santa Clara, Calif. The system 500 generally includes a processing chamber 502 coupled to a gas source 504. The processing chamber 502 has walls 506 and a bottom 508 that partially define a process volume 512. The process volume 512 is typically accessed through a port (not shown) in the walls 506 that facilitate movement of a substrate 540 into and out of the processing chamber 502. The walls 506 and bottom 508 may be fabricated from a unitary block of aluminum or other material compatible with processing. The walls 506 support a lid assembly 510 that contains a pumping plenum 514 that couples the process volume 512 to an exhaust port (that includes various pumping components, not shown). Alternatively, an exhaust port (not shown) is located in the floor of processing chamber 502 and process volume 512 does not require a pumping plenum 514.

A temperature controlled substrate support assembly 538 is centrally disposed within the processing chamber 502. The support assembly 538 supports a glass substrate 540 during processing. In one embodiment, the substrate support assembly 538 comprises an aluminum body 524 that encapsulates at least one embedded heater 532. The heater 532, such as a resistive element, disposed in the support assembly 538, is coupled to an optional power source 574 and controllably heats the support assembly 538 and the glass substrate 540 positioned thereon to a predetermined temperature. Typically, in a CVD process, the heater 532 maintains the glass substrate 540 at a uniform temperature between about 150 to at least about 460 degrees Celsius, depending on the deposition processing parameters for the material being deposited.

Generally, the support assembly 538 has a lower side 526 and an upper side 534. The upper side 534 supports the glass substrate 540. The lower side 526 has a stem 542 coupled thereto. The stem 542 couples the support assembly 538 to a lift system (not shown) that moves the support assembly 538 between an elevated processing position (as shown) and a lowered position that facilitates substrate transfer to and from the processing chamber 502. The stem 542 additionally provides a conduit for electrical and thermocouple leads between the support assembly 538 and other components of the system 500.

A bellows 546 is coupled between support assembly 538 (or the stem 542) and the bottom 508 of the processing chamber 502. The bellows 546 provides a vacuum seal between the process volume 512 and the atmosphere outside the processing chamber 502 while facilitating vertical movement of the support assembly 538.

The support assembly 538 generally is grounded such that radio frequency (RF) power supplied by a power source 522 to a gas distribution plate assembly 518 positioned between the lid assembly 510 and substrate support assembly 538 (or other electrode positioned within or near the lid assembly of the chamber) may excite gases present in the process volume 512 between the support assembly 538 and the distribution plate assembly 518. The RF power from the power source 522 is generally selected commensurate with the size of the substrate to drive the chemical vapor deposition process.

The lid assembly 510 provides an upper boundary to the process volume 512. In one embodiment, the lid assembly 510 is fabricated from aluminum (Al). The lid assembly 510 includes a pumping plenum 514 formed therein coupled to an external pumping system (not shown). The pumping plenum 514 is utilized to channel gases and processing by-products uniformly from the process volume 512 and out of the processing chamber 502.

The lid assembly 510 typically includes an entry port 580 through which process gases provided by the gas source 504 are introduced into the processing chamber 502. The entry port 580 is also coupled to a cleaning source 582. The cleaning source 582 typically provides a cleaning agent, such as dissociated fluorine, that is introduced into the processing chamber 502 to remove deposition by-products and films from processing chamber hardware, including the gas distribution plate assembly 518.

The gas distribution plate assembly 518 is coupled to an interior side 520 of the lid assembly 510. The shape of gas distribution plate assembly 518 is typically configured to substantially conform to the perimeter of the glass substrate 540, for example, polygonal for large area flat panel substrates and circular for wafers. The gas distribution plate assembly 518 includes a perforated area 516 through which process and other gases supplied from the gas source 504 are delivered to the process volume 512. The perforated area 516 of the gas distribution plate assembly 518 is configured to provide uniform distribution of gases passing through the gas distribution plate assembly 518 into the processing chamber 502. Gas distribution plates that may be adapted to benefit from the invention are described in commonly assigned U.S. patent application Ser. No. 09/922,219, filed Aug. 8, 2001 by Keller et al., U.S. patent application Ser. No. 10/140,324, filed May 6, 2002 by Yim et al., and Ser. No. 10/337,483, filed Jan. 7, 2003 by Blonigan et al., U.S. Pat. No. 6,477,980, issued Nov. 12, 2002 to White et al., U.S. patent application Ser. No. 10/417,592, filed Apr. 16, 2003 by Choi et al., and U.S. patent application Ser. No. 10/823,347, filed on Apr. 12, 2004 by Choi et al., which are hereby incorporated by reference in their entireties.

The gas distribution plate assembly 518 typically includes a diffuser plate (or distribution plate) 558 suspended from a hanger plate 560. The diffuser plate 558 and hanger plate 560 may alternatively comprise a single unitary member. A plurality of gas passages 562 are formed through the diffuser plate 558 to allow a predetermined distribution of gas to pass through the gas distribution plate assembly 518 and into the process volume 512. A plenum 564 is formed between hanger plate 560, diffuser plate 558 and the interior surface 520 of the lid assembly 510. The plenum 564 allows gases flowing through the lid assembly 510 to uniformly distribute across the width of the diffuser plate 558 so that gas is provided uniformly above the center perforated area 516 and flows with a uniform distribution through the gas passages 562.

The diffuser plate 558 is typically fabricated from stainless steel, aluminum (Al), nickel (Ni) or other RF conductive material. The diffuser plate 558 could be cast, brazed, forged, hot iso-statically pressed or sintered. In one embodiment, the diffuser plate is fabricated from bare, non-anodized aluminum. A non-anodized aluminum surface for diffuser plate 558 has been shown to reduce the formation of particles thereon that may subsequently contaminate substrates processed in PECVD system 500. Additionally, the manufacturing cost of diffuser plate 558 is reduced when it is not anodized. A suitable bare aluminum surface for diffuser plate 558 is generally free from scratches and burrs, chemically cleaned before use to eliminate unwanted contamination and may be mechanically polished or electro-polished. A non-anodized aluminum diffuser plate that may be adapted to benefit from the invention is described commonly assigned U.S. Pat. No. 6,182,603, entitled "Surface-Treated Shower Head For Use In a Substrate Processing Chamber," filed Jul. 13, 1998 by Shang et al. The thickness of the diffuser plate 558 is between about 0.8 inch to about 2.0 inches. The diffuser plate 558 could be circular for semiconductor wafer manufacturing or polygonal, such as rectangular, for flat panel display manufacturing.

It has been standard practice in the art for diffuser plate 558 to be configured substantially flat and parallel to substrate 540 and for the distribution of identical gas passages 562 to be substantially uniform across the surface of diffuser plate 558. Such a configuration of diffuser 558 has provided adequate gas flow and plasma density uniformity in process volume 512 for depositing films on substrates smaller than 1,200,000 mm². Hence, when depositing SiN, α-Si and other thin films in PECVD chambers on substrates smaller than 1,200,000 mm², thickness uniformity and film property uniformity can be achieved on deposited films solely by changing process parameters, such as process gas flow rates, plasma power, substrate temperature, and process chamber pressure. As substrates increase in size, however, the uniformity of deposited films—especially SiN and α-Si films—has become more difficult to maintain. A flat diffuser plate 558 with a uniform distribution of gas passages 562 of uniform size and shape is generally not able to deposit films with acceptable thickness and film property uniformity onto large area substrates.

Hollow Cathode Gradient

The uniformity of film thickness and film properties for PECVD films becomes more difficult to maintain when deposited on larger substrates, i.e., at least about 1,000 mm by about 1,200 mm. For SiN films, the thickness across the substrate appears "dome shaped" with film in the center region thicker than the edge region. The effect is worse on larger substrates.

It has been shown that for a SiN film deposited on a substrate larger than about 1,200,000 mm in a PECVD chamber, the film thickness and film property uniformity can be improved by use of a hollow cathode gradient, or HCG. The HCG method is described below in conjunction with FIGS. 6A and 8 and in previously referenced U.S. patent application Ser. No. 10/889,683, entitled "Plasma Uniformity Control By Gas Diffuser Hole Design." A diffuser plate 558 that is configured with HCG improves the uniformity of SiN film thickness and film properties by altering the plasma distribution in process volume 512. This is because deposition of films by PECVD depends substantially on the source of the active plasma. Hence, non-uniform plasma distribution in process volume 512 can lead to poor film uniformity on the substrate 540.

Figure 6A:
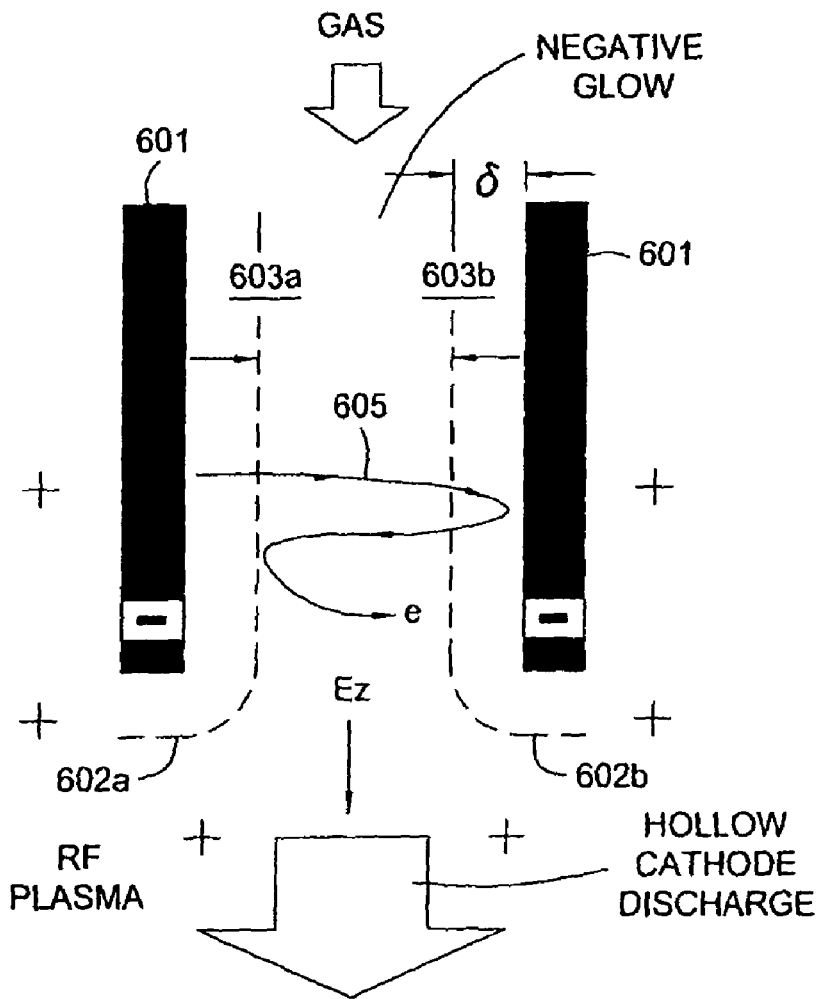
FIG. 6A schematically shows an RF hollow cathode.
Figure 8:
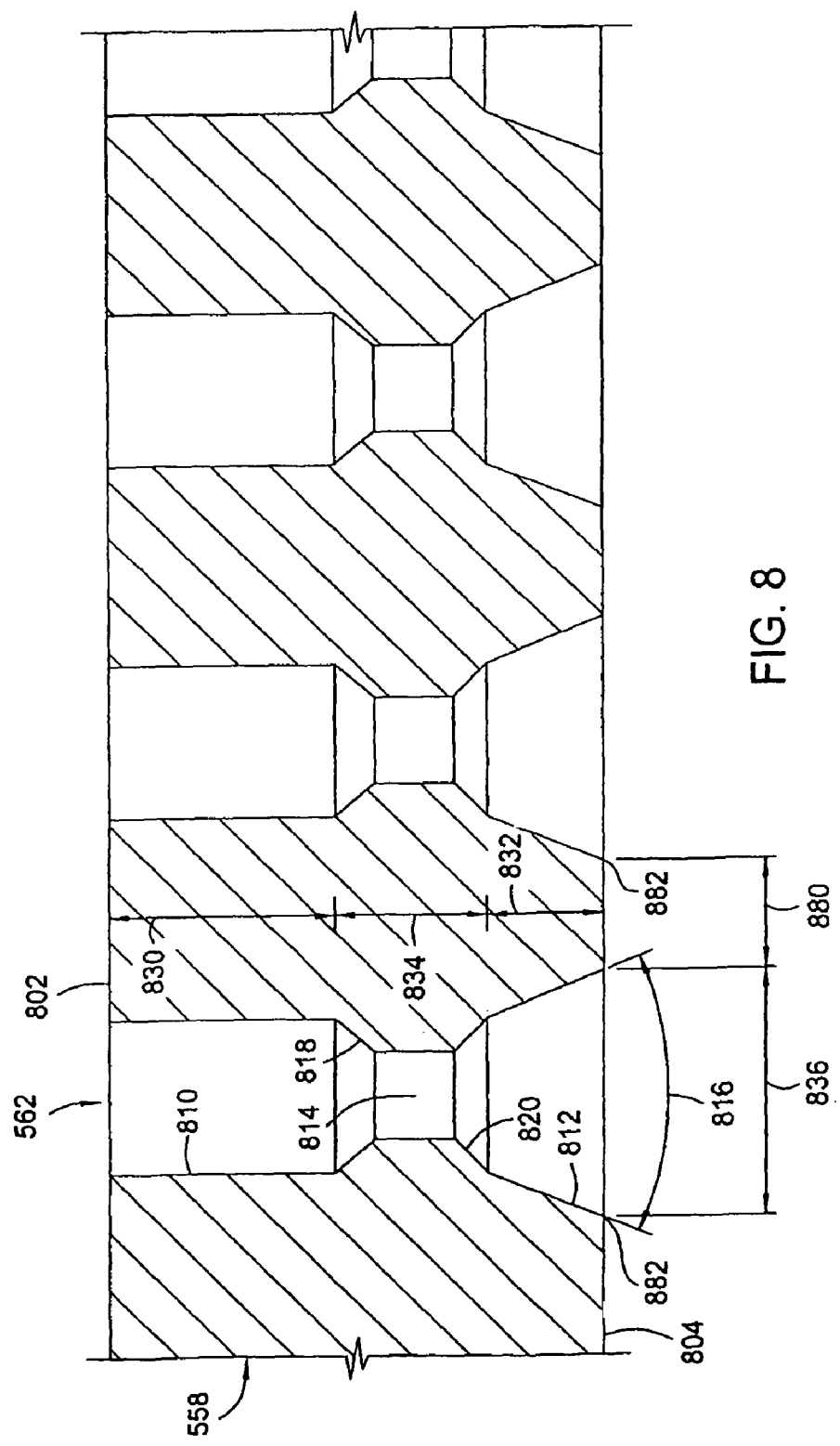
FIG. 8 depicts a cross-sectional schematic view of a gas diffuser plate.

Dense chemically reactive plasma can be generated in process volume 512 of PECVD system 500 due to the hollow cathode effect, described here in conjunction with FIG. 6A. The driving force in the RF generation of a hollow cathode discharge of a negatively charged RF electrode 601 is the frequency modulated DC voltage $V_s$, known as the self-bias voltage, across space charge sheath, or wall sheath, 602a or 602b at the RF electrode 601. FIG. 6A schematically shows an RF hollow cathode and the oscillatory movement of electrons, "e", between repelling electric fields, 603a and 603b, of the opposing space charge sheaths 602a and 602b, respectively. The thickness of space charge sheaths 602a and 602b is equal to thickness "δ". Electron "e" is emitted from the cathode wall, in this case RF electrode 601, which could be the walls of a gas passage 562 that is close to the process volume 512. Gas passage 562 and process volume 512 are shown in FIGS. 5 and 8. Referring again to FIG. 6A, electron "e" is accelerated by the electric field 603a across the space charge sheath 602a. Electron "e" oscillates along path 605 across the inner space between walls of the RF electrode 601 owing to the repelling fields of opposing space charge sheath 602a and 602b. Electron "e" loses energy by collisions with the process gas and creates more ions. The created ions can be accelerated to the RF electrode 601, thereby enhancing emissions of secondary electrons, which could create additional ions. Overall, the cavities between the cathode walls enhance the electron emission and ionization of the gas. Cone frustum-shaped features in the cathode walls, such as when the gas passages formed in the diffuser plate with a gas inlet diameter smaller than the gas outlet diameter, are more efficient in ionizing the gas than cylindrical walls. An example of a cone frustum-shaped cathode cavity is described in more detail below in conjunction with FIG. 8. The potential Ez is created due to the difference in ionization efficiency between the gas inlet and gas outlet.

For diffuser plate 558, the hollow cathode cavities are located on the downstream ends of gas passages 562 and are close to the process volume 512. It has been shown that by changing the design of the walls of the cathode cavities of gas passages 562 and the arrangement or density of the hollow cathode cavities, the gas ionization may be modified to control plasma density and, hence, the film thickness and property uniformity of a deposited SiN film. The methods and results that prove this are described in previously referenced U.S. patent application Ser. No. 10/889,683, entitled "Plasma Uniformity Control By Gas Diffuser Hole Design." An example of hollow cathode cavities that are close to the process volume 512 is the second bore 812 of FIG. 8. The hollow cathode effect mainly occurs in the cone frustum-shaped region of second bore 812 that faces the process volume 512. The FIG. 8 design is merely used as an example. The invention can be applied to other types of hollow cathode cavity designs. Other examples of hollow cathode cavity design include, but are not limited to, the designs shown in FIGS. 6B-6G. By varying the volume and/or the surface area of the hollow cathode cavity, i.e. second bore 812, the plasma ionization rate can be varied.

FIG. 8 is a partial sectional view of an exemplary diffuser plate 558 that may be adapted to benefit from the invention and is described in commonly assigned U.S. patent application Ser. No. 10/417,592, titled "Gas Distribution Plate Assembly for Large Area Plasma Enhanced Chemical Vapor Deposition", filed on Apr. 16, 2003, which is hereby incorporated by reference in its entirety to the extent not inconsistent with the claimed invention. The diffuser plate 558 includes a first or upstream side 802 facing the lid assembly 510 and an opposing second or downstream side 804 that faces the support assembly 538. Each gas passage 562 is defined by a first bore 810 coupled by an orifice hole 814 to a second bore 812 that combine to form a fluid path through the gas distribution plate 558. The first bore 810 extends a first depth 830 from the upstream side 802 of the gas distribution plate 558 to a bottom 818. The bottom 818 of the first bore 810 may be tapered, beveled, chamfered or rounded to minimize the flow restriction as gases flow from the first bore into the orifice hole 814. The first bore 810 generally has a diameter of about 0.093 to about 0.218 inches, and in one embodiment is about 0.156 inches.

The second bore 812 is formed in the diffuser plate 558 and extends from the downstream side (or end) 804 to a depth 832 of about 0.10 inch to about 2.0 inches. Preferably, the depth 832 is between about 0.1 inch to about 1.0 inch. The opening diameter 836 of the second bore 812 is generally about 0.1 inch to about 1.0 inch and may be flared at an angle 816 of about 10 degrees to about 50 degrees. Preferably, the opening diameter 836 is between about 0.1 inch to about 0.5 inch and the flaring angle 816 is between 20 degrees to about 40 degrees. The surface area of the second bore 812 is between about 0.05 inch$^2$ to about 10 inch$^2$ and preferably between about 0.05 inch$^2$ to about 5 inch$^2$. The diameter of second bore 812 refers to the diameter intersecting the downstream surface 804. An example of a diffuser plate, used to process 1870 mm by 2200 mm substrates, has second bores 812 at a diameter of 0.302 inch and at a flare angle 816 of about 22 degrees. The distances 880 between rims 882 of adjacent second bores 812 are between about 0 inch to about 0.6 inch, preferably between about 0 inch to about 0.4 inch. The diameter of the first bore 810 is usually, but not limited to, being at least equal to or smaller than the diameter of the second bore 812. A bottom 820 of the second bore 812 may be tapered, beveled, chamfered or rounded to minimize the pressure loss of gases flowing out from the orifice hole 814 and into the second bore 812. Moreover, as the proximity of the orifice hole 814 to the downstream side 804 serves to minimize the exposed surface area of the second bore 812 and the downstream side 804 that face the substrate, the downstream area of the diffuser plate 558 exposed to fluorine provided during chamber cleaning is reduced, thereby reducing the occurrence of fluorine contamination of deposited films.

The orifice hole 814 generally couples the bottom 818 of the first hole 810 and the bottom 820 of the second bore 812. The orifice hole 814 generally has a diameter of about 0.01 inch to about 0.3 inch, preferably about 0.01 inch to about 0.1 inch, and typically has a length 834 of about 0.02 inch to about 1.0 inch, preferably about 0.02 inch to about 0.5 inch. The length 834 and diameter (or other geometric attribute) of the orifice hole 814 is the primary source of back pressure in the plenum 564 which promotes even distribution of gas across the upstream side 802 of the gas distribution plate 558. The orifice hole 814 is typically configured uniformly among the plurality of gas passages 562; however, the restriction through the orifice hole 814 may be configured differently among the gas passages 562 to promote more gas flow through one area of the gas distribution plate 558 relative to another area. For example, the orifice hole 814 may have a larger diameter and/or a shorter length 834 in those gas passages 562, of the gas distribution plate 558, closer to the wall 506 of the processing chamber 502 so that more gas flows through the edges of the perforated area 516 to increase the deposition rate at the perimeter of the glass substrate. The thickness of the diffuser plate is between about 0.8 inch to about 3.0 inches, preferably between about 0.8 inch to about 2.0 inch.

Figure 7:
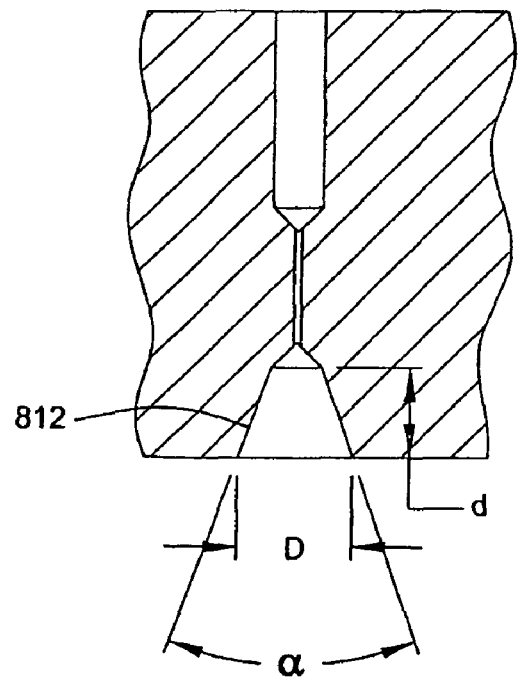
FIG. 7 shows the definition of diameter "D", the depth "d" and the flaring angle "$\alpha$" of the bore that extends to the downstream end of a gas passage.

The volume of second bore (or hollow cathode cavity) 812 can be changed by varying the diameter "D" (or opening diameter 836 in FIG. 8), the depth "d" (or length 832 in FIG. 8) and the flaring angle "α" (or flaring angle 816 of FIG. 8), as shown in FIG. 7. Changing the diameter, depth and/or the flaring angle would also change the surface area of the second bore 812. It is believed that higher plasma density is likely the cause of the higher deposition rate at the center of substrate 540 (shown in FIG. 5). By reducing the bore depth, the diameter, the flaring angle, or a combination of these three parameters from edge to center of the diffuser plate, the plasma density can be reduced in the center region of the substrate to improve the uniformity of film thickness and film properties. Methods and results that indicate this are described in previously referenced U.S. patent application Ser. No. 10/889,683, entitled "Plasma Uniformity Control By Gas Diffuser Hole Design."

It is also indicated that changes to hollow cathode cavity design on a diffuser plate must be gradual across the face of the diffuser plate to avoid stepped changes in film thickness on the substrate. However, the changes of diameters and/or lengths of the hollow cathode cavities do not have to be perfectly continuous from center of the diffuser plate to the edge of the diffuser plate, as long the changes are smooth and gradual. For example, sufficiently gradual change to the hollow cathode cavity design on a diffuser plate can be accomplished by a number of uniform zones arranged in a concentric pattern as long as the change from zone to zone is sufficiently small. But, there needs to be an overall increase of size (volume and/or surface area) of hollow cathode cavity from the center of the diffuser plate to the edge of the diffuser plate. For example, it has been shown that for a diffuser plate that is 1000 mm by 1200 mm, using only three concentric zones, wherein the hollow cathode cavity cone frustum depth increases 35% from zone to zone, is inadequate for producing acceptable film thickness uniformity. In this instance, the number of zones should be increased and the zone-to-zone variation in cone frustum depth reduced to avoid distinct changes in film thickness corresponding to each zone. The number of zones used and amount of variation between zones is dependent on several factors, including size of diffuser plate and magnitude of center thick film non-uniformity to be corrected and may be determined by one skilled in the art for a given situation.

Figure 9C:
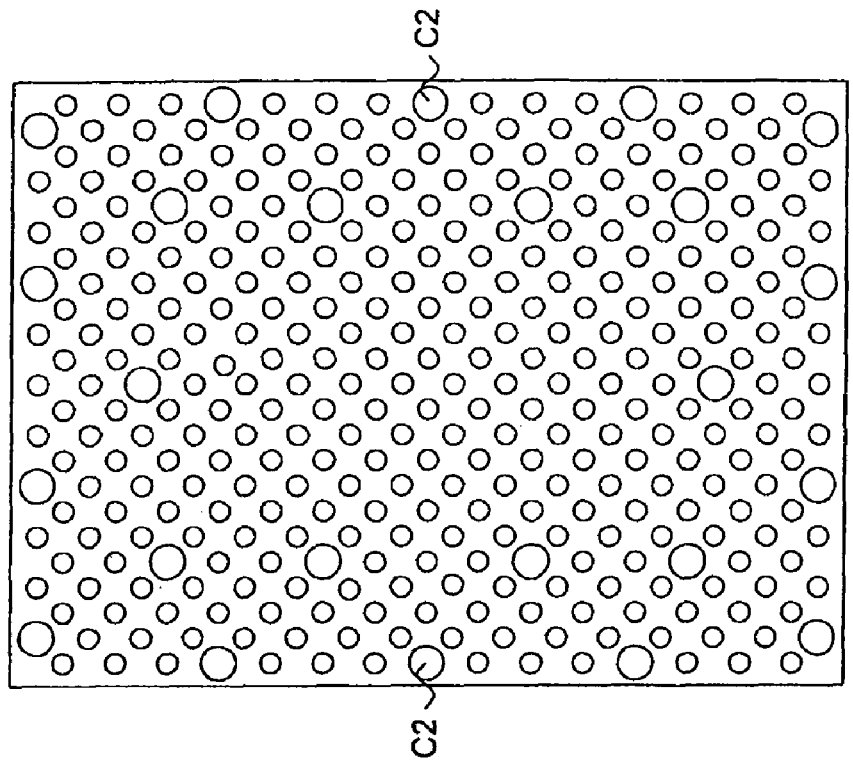
FIG. 9C shows a diffuser plate with most of the hollow cathode cavities the same, while there are a few larger hollow cathode cavities near the edge of the diffuser plate.

FIG. 9A shows a schematic plot of bottom view (looking down at the downstream side) of a diffuser plate. The diffuser plate is divided into N concentric zones. Concentric zones are defined as areas between inner and outer boundaries, which both have the same geometric shapes as the overall shape of the diffuser plate. Within each zone, the diffuser holes are identical. Zones may be square, rectangular or circular. From zone 1 to zone N, the hollow cathode cavities gradually increase in size (volume and/or surface area). The increase can be accomplished by increase of hollow cathode cavity diameter, length, flaring angle, or a combination of these parameters.

Figure 9B:
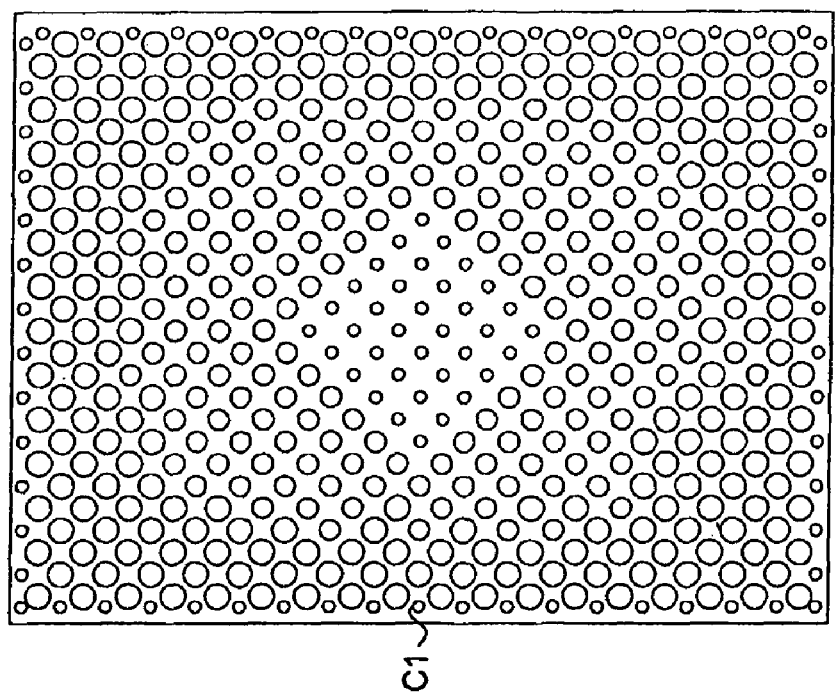
FIG. 9B shows a diffuser plate with mixed hollow cathode cavity diameters and the inner region hollow cathode cavity volume and/or surface area density is lower than the outer region hollow cathode cavity volume and/or surface area density.

The increase of diameters and/or lengths of the hollow cathode cavities from center to edge of the diffuser plate also do not have to apply to all second bores 812, as long as there is an overall increase in the size (volume and/or surface area) of hollow cathode cavities per downstream diffuser plate surface area. For example, some second bores 812 could be kept the same throughout the diffuser plate, while the rest of the second bores 812 have a gradual increase in the sizes (volumes and/or surface areas) of the hollow cathode cavities. In another example, the diffuser second bores 812 have a gradual increase in sizes (volumes and/or surface areas) of the hollow cathode cavities, while there are also some small hollow cathode cavities C1 at the edge of the diffuser plate to further increase the overall hollow cathode cavity volume and/or surface area per downstream diffuser plate surface area. This example is shown in FIG. 9B, which is a schematic plot of a bottom view of a diffuser plate. In yet another example, most of the hollow cathode cavities are uniform across the diffuser plate, while there are a few larger hollow cathode cavities C2 towards the edge of the diffuser plate, as shown in a schematic plot of a diffuser bottom in FIG. 9C.

Plasma and process uniformities can be improved by gradually increasing either the volume or surface area or a combination of both of the hollow cathode cavities from the center region of the diffuser plate to the edge region of the diffuser plate.

Figure 9D:
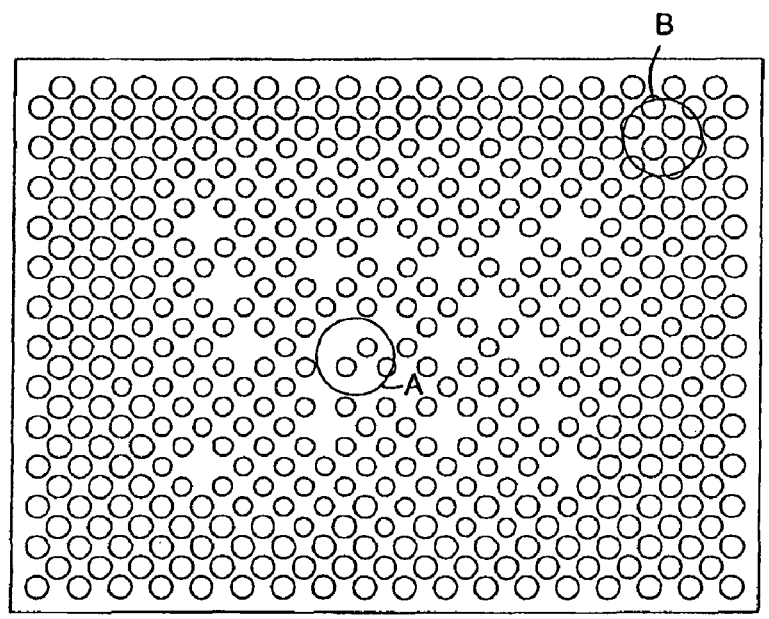
FIG. 9D shows the downstream side view of a diffuser plate with varying diffuser hole densities.

Another way to change the film deposition thickness and property uniformity is by changing the diffuser hole density across the diffuser plate, while keeping the diffuser holes identical. The density of diffuser holes is calculated by dividing the total surface of holes of bores 812 intersecting the downstream side 804 by the total surface of downstream side 804 of the diffuser plate in the measured region. The density of diffuser holes can be varied from about 10% to about 100%, and preferably varied from 30% to about 100%. To reduce the "dome shape", or center thick, problem for SiN films, the diffuser holes density should be lowered in the central region, compared to the outer region, to reduce the plasma density in the inner region. As noted above for changes in volume density and surface area density, the cathode cavity density changes from the inner region to the outer region should be gradual and smooth to ensure uniform and smooth deposition and film property profiles. FIG. 9D shows the gradual change of diffuser holes density from low in the center (region A) to high at the edge (region B). The lower density of diffuser holes in the center region would reduce the plasma density in the center region and reduce the "dome shape" problem for SiN films. The arrangement of the diffuser holes in FIG. 9D is merely used to demonstrate the increasing diffuser holes densities from center to edge. The invention applies to any diffuser holes arrangement and patterns. The density change concept can also be combined with the diffuser hole design change to improve center to edge uniformity. When the density of the gas passages is varied to achieve the plasma uniformity, the spacing of hollow cathode cavities at the downstream end could exceed 0.6 inch.

Gas Diffuser With Curvature

As previously discussed in conjunction with FIGS. 2, 3, and 4, when depositing α-Si films on large substrates, the use of a hollow cathode gradient gas diffuser plate may not be able to eliminate film thickness uniformity issues. This is in contrast to SiN film uniformity problems, which may be eliminated for substrates larger than 1,200,000 mm$^2$ by the use of a gas diffuser plate adapted with an embodiment of the HCG. From FIGS. 2, 3, and 4, it can be seen that the thickness profile of an amorphous silicon film deposited by PECVD is instead strongly affected by electrode spacing; varying the electrode spacing from 0.800 inches to 0.550 inches alters the profile from center thick with good film properties in the center to edge thick and poor film properties in the center. Referring to FIGS. 5 and 8, electrode spacing is defined as the distance between downstream side 804 of diffuser plate 558 and substrate 540. For α-Si films on large substrates, it is believed that during substrate processing, plasma density increases near the center of a PECVD chamber for wider electrode spacings, thus altering the film thickness and film property profile.

Because a narrower electrode spacing in a PECVD chamber forms an amorphous silicon film with preferred qualities at the edges of the substrate and a relatively wider electrode spacing forms a film with preferred qualities at the center of the substrate, a diffuser plate is provided that combines the benefits of both spacings. This is done by incorporating the wider and narrower spacings into the electrode itself, i.e., the electrode is adapted to provide a wider electrode spacing over the center region of the substrate and a narrower electrode spacing over the edge of the substrate. Hence, substrates larger than about 1,200,000 mm$^2$ may be deposited with amorphous silicon films that have acceptable thickness and film property uniformity across the entire substrate. This is accomplished by configuring the diffuser plate/electrode with a curvature on the down-stream, or process volume, side instead of being substantially flat and parallel to the substrate being processed. By incorporating the wider and narrower spacings into the electrode itself, the process window for α-Si is greatly improved.

Figure 10:
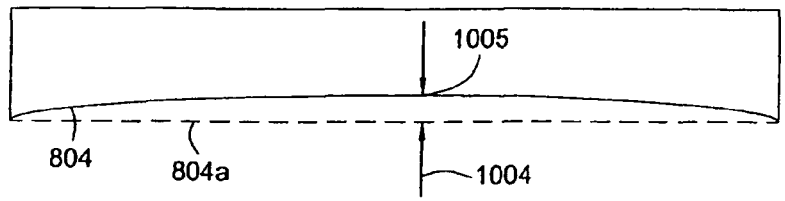
FIG. 10 illustrates a schematic cross-section of one embodiment of a gas diffuser plate with a curvature.

FIG. 10 illustrates a schematic cross-section of one embodiment of a gas diffuser plate 1001 with a curvature that may be adapted for use in a PECVD chamber. Gas passages 562 are not shown for clarity. Downstream side 804 of diffuser plate 1001 has a curvature and in this embodiment upstream side 802 of diffuser plate 1001 is substantially flat. Alternatively, upstream side 802 of diffuser plate 1001 may also have a curvature, for example when diffuser 1001 is formed by a method using a curvature annealing fixture, described below in conjunction with FIGS. 12 and 13. The maximum displacement 1004 between the curved surface of the downstream side 804 and the surface of a fictitious flat downstream side 804 a is also shown.

As noted above, for improving uniformity of SiN films, it is necessary for the hollow cathode gradient to implement gradual change of hollow cathode cavity volume density, hollow cathode surface area density and/or hollow cavity density across the surface of the gas diffuser. This avoids non-uniformities of the SiN film due to abrupt changes in plasma density in the process volume caused by a hollow cathode gradient that is too great. It is believed that the same principle holds true for improving the film thickness and film property uniformity of amorphous silicon films via an electrode/diffuser plate that is adapted to have a varying electrode spacing over a substrate. Hence, the transition from the narrow spacing region above the edge of the substrate to the slightly wider spacing region above the center of the substrate is preferably smooth and gradual. Therefore, the downstream side 804 of diffuser 1001 is preferably substantially concave, i.e., relatively closer to the substrate around the edges and smoothly transitioning to a high point, or apex 1005, over the center of the substrate.

Figure 10A:
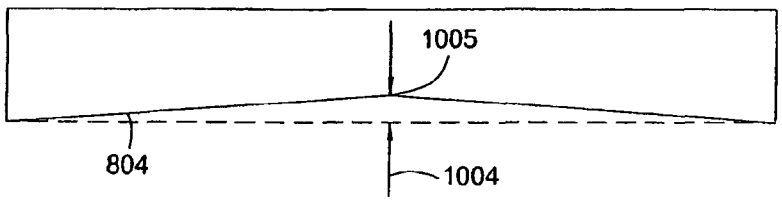
FIG. 10A illustrates a schematic cross-section of one embodiment of a gas diffuser plate with a curvature.

The curvature of downstream side 804 is generally an arc with an apex 1005 located approximately over the center point of the substrate. The apex 1005 defines the maximum displacement 1004 between the curved surface of the downstream side 804 and the surface of the fictitious flat downstream side 804a, as shown in FIG. 10. In the preferred embodiment, the arc has the curvature corresponding to a segment of a circle or ellipse, as shown in FIG. 10. This ensures a smooth transition in electrode spacing from the edge to the center of the diffuser and allows the shape to be easily quantified. In other embodiments, different methods of describing the curved downstream side 804 may be used. In one aspect, a line segment, as shown in FIG. 10A, may describe the arc. In this aspect, the apex 1005 of diffuser 1002 is still located substantially over the center point of the substrate and the electrode spacing increases from the edge of the diffuser to the center. In other aspects, the arc may be described by a segment of other mathematical functions besides lines, circles or ellipses, such as exponential, second-order, third-order, sinusoidal, hyperbolic or other geometric functions. In all aspects, apex 1005 is located approximately over the center point of the substrate and the electrode spacing increases from the edge of the diffuser to the center.

Figure 10B:
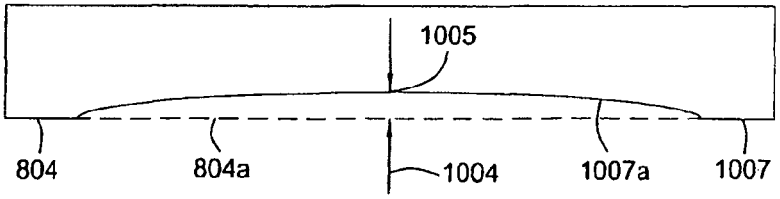
FIG. 10B illustrates a schematic cross-section of one embodiment of a gas diffuser plate with a curvature.

In another configuration, the entire surface of downstream side 804 does not have a curvature, as shown in FIG. 10B. Downstream side 804 of diffuser 1003 includes a substantially flat region 1007 at the edge of diffuser 1003. Curved segment 1007a of downstream side 804 may be described by a segment of a line, circle, ellipse or other mathematical function as described above for other configurations of the invention. As with other aspects described above, apex 1005 is located approximately over the center point of the substrate and the electrode spacing increases from the edge of the diffuser to the center.

The magnitude of maximum displacement 1004 between the surface of the curved downstream side 804 and the surface of a fictitious flat downstream side 804a is small relative to the size of diffuser plate 1001. In one aspect, maximum displacement 1004 is no more than about 3% of the characteristic length of the diffuser, preferably from about 0.01% to about 0.30%. For purposes of comparing displacement 1004 to a rectangular or circular diffuser, the characteristic length is considered to be the "equivalent radius". For a circular diffuser, the equivalent radius is equal to the radius of the diffuser. For a square or rectangular diffuser, the equivalent radius is one half the diagonal. Hence, in the case of a diffuser that is 2200 mm×1870 mm, the equivalent radius is 1440 mm and the maximum desired displacement 1004 of the curved downstream side 804 from the fictitious flat downstream side 804a is about 4.3 mm.

It is important to note that curvature of downstream side 804 does not have to be precisely fit to a particular PECVD chamber to be beneficial to the process of depositing amorphous silicon films; process tuning of other process parameters is necessary regardless of electrode shape to optimize the uniformity of film thickness and film properties for a film. The advantage of using an electrode with a curved downstream side is that it greatly increases the process window for α-Si film properties, making the formation of high quality amorphous silicon films on large substrates easier and more reliable for mass production. In some cases, an electrode having curvature is necessary to make the formation of acceptable α-Si films even possible.

Figure 10C:
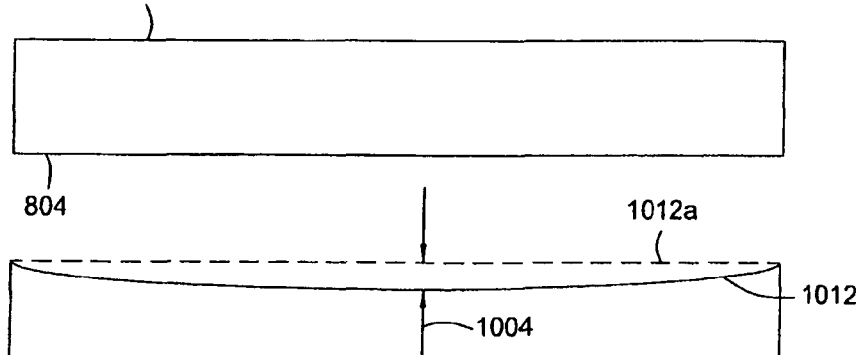
Figure 10D:
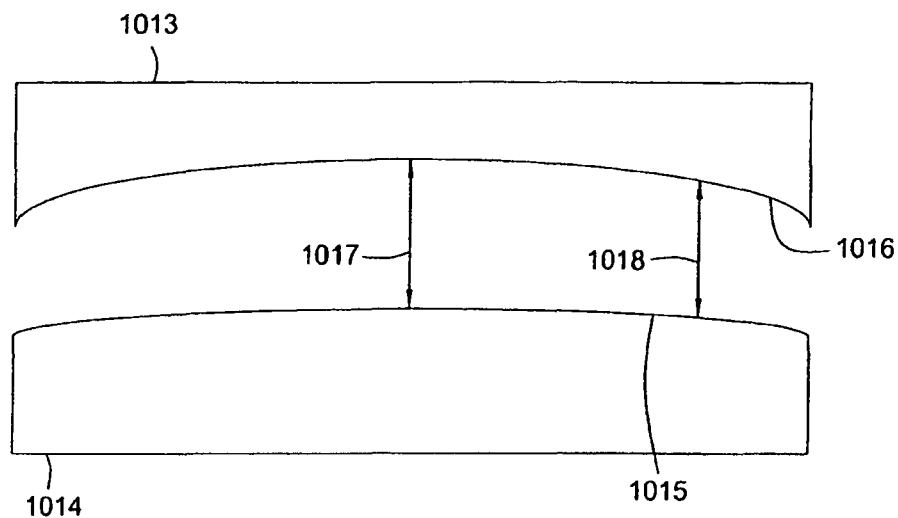

In another embodiment, the wider electrode spacing in the center region of the diffuser is achieved through a curvature of the substrate support. In one aspect, shown schematically in FIG. 10C, the diffuser plate 1010 has a substantially flat downstream side 804 and substrate support 1011 has a curvature with a maximum displacement 1004. For substrate support 1011, maximum displacement 1004 is defined as the distance between the substrate support curved surface 1012 of the surface of a fictitious flat substrate support surface 1012a, as shown in FIG. 10C. This aspect of the invention allows for the wide center region spacing and narrow edge region spacing desired for depositing α-Si films while using a substantially flat diffuser plate. In another aspect, both the diffuser plate and the substrate support may each have a curvature, wherein the curvatures are adapted so that the desired wide center region spacing and narrow edge region spacing is achieved. This aspect is shown schematically in FIG. 10D. The curved downstream surface 1016 of diffuser plate 1013 has a more pronounced curvature than the substrate support curved surface 1015 of substrate support 1014. Because of this, center region electrode spacing 1017 is larger than edge region electrode spacing 1018. Hence, the desired wide center region spacing and narrow edge region spacing may be achieved when a diffuser plate and substrate support both have a curvature.

Figure 11:
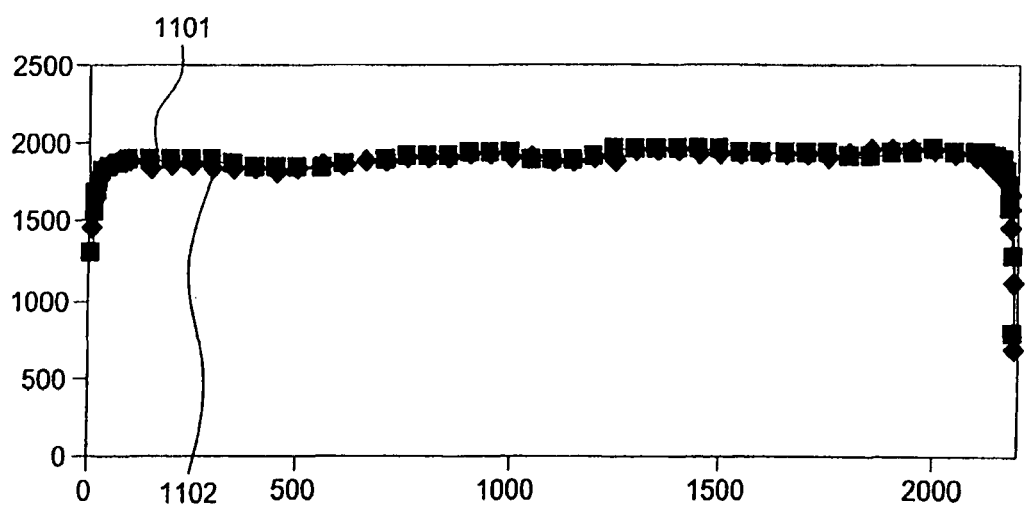
FIG. 11 shows thickness profiles of an amorphous silicon film across a glass substrate using a diffuser plate with a curvature.

FIG. 11 shows thickness profiles 1101 and 1102 of an amorphous silicon film across a 2200 mm wide glass substrate using a diffuser plate having a curvature with a maximum displacement 1004 of 0.100 inches. The electrode spacing was 0.650 inches while depositing the film. Process conditions during deposition of the film were: 10,000 sccm SiH4 gas flow rate, 36,000 sccm $H_2$ gas flow rate, 10,000 W RF plasma power, chamber pressure of 2.5 Torr and substrate temperature of 340° C. (inner substrate heater) to 360° C. (outer substrate heater). The abscissa represents the position, in millimeters, of each thickness measurement along the profile of the 2200 mm long substrate. The ordinate represents the deposition rate, in Å/min, of the amorphous silicon film deposited on the substrate. Two data sets are illustrated in FIG. 11, data set 1101 by squares, data set 1102 by diamonds. Data sets 1101 and 1102 represent the deposition rate profile measured along each diagonal of the substrate. The difference between the two profiles is negligible, implying a constant thickness profile across the length of the diffuser.

A qualitative comparison of the film thickness profiles in FIG. 11 to the profiles in FIGS. 2, 3 and 4 indicates a significant improvement of the thickness uniformity when using an HCG diffuser having a curvature over a substantially flat HCG diffuser. This improvement is quantified in Table 1.

TABLE 1

Measurement of thickness uniformity of α-Si film deposited on substrate.

| FIG. | Curved | Spacing (inches) | Dep Rate (Å/min) | Thickness Uniformity (%) | |
|---|---|---|---|---|---|
| | | | | 15 mm Edge Exclusion | 20 mm Edge Exclusion |
| 2 | NO | 0.800 | 1497 | 27.3 | 23.4 |
| 3 | NO | 0.650 | 1583 | 25.0 | 21.0 |
| 4 | NO | 0.550 | 1906 | 16.3 | 16.3 |
| 11 | YES | 0.650 | 1889 | 12.1 | 8.1 |

The film deposited with a diffuser having curvature has a high deposition rate and improved uniformity over the films deposited with a flat diffuser plate.

In one aspect, a PECVD gas diffuser is adapted with a curved downstream side and no hollow cathode gradient. This diffuser improves the film thickness uniformity and film property uniformity of α-Si films deposited on substrates larger than about 1,200,000 $mm^2$. In another aspect, a PECVD gas diffuser is adapted with a curved downstream side and a hollow cathode gradient. Diffusers so adapted may be used for the processing of either SiN or α-Si films. This reduces production costs of PECVD chambers and increases chamber flexibility, i.e., a chamber may be used for deposition of either SiN or α-Si films without changing gas diffuser plates.

Manufacturing Methods

Diffuser plates for processing substrates larger than about 1000 mm×1200 mm may be difficult to manufacture repeatably. There may be significant variation from the desired shape and/or from diffuser-to-diffuser. This is particularly true for diffuser plates that are not substantially flat, such as diffusers with a curved downstream surface. Because film thickness uniformity and film property uniformity are strongly dependent on electrode spacing for some thin films, such as α-Si, it is important to minimize variations that may occur between the final curvature of a diffuser after manufacturing and the intended shape. It is also important to minimize variations that may occur between different—but nominally identical—chambers. Methods are provided to allow the manufacturing of curved diffusers for a PECVD chamber in a repeatable and cost-effective manner.

In one embodiment, the desired curvature of the downstream side of the gas diffuser plate is formed by a thermal process in which the diffuser plate is bent to conform to the shape of a curvature annealing fixture. The curvature annealing fixture is a metal plate machined to the desired curvature and is used for bending a large number of diffusers.

Figure 12:
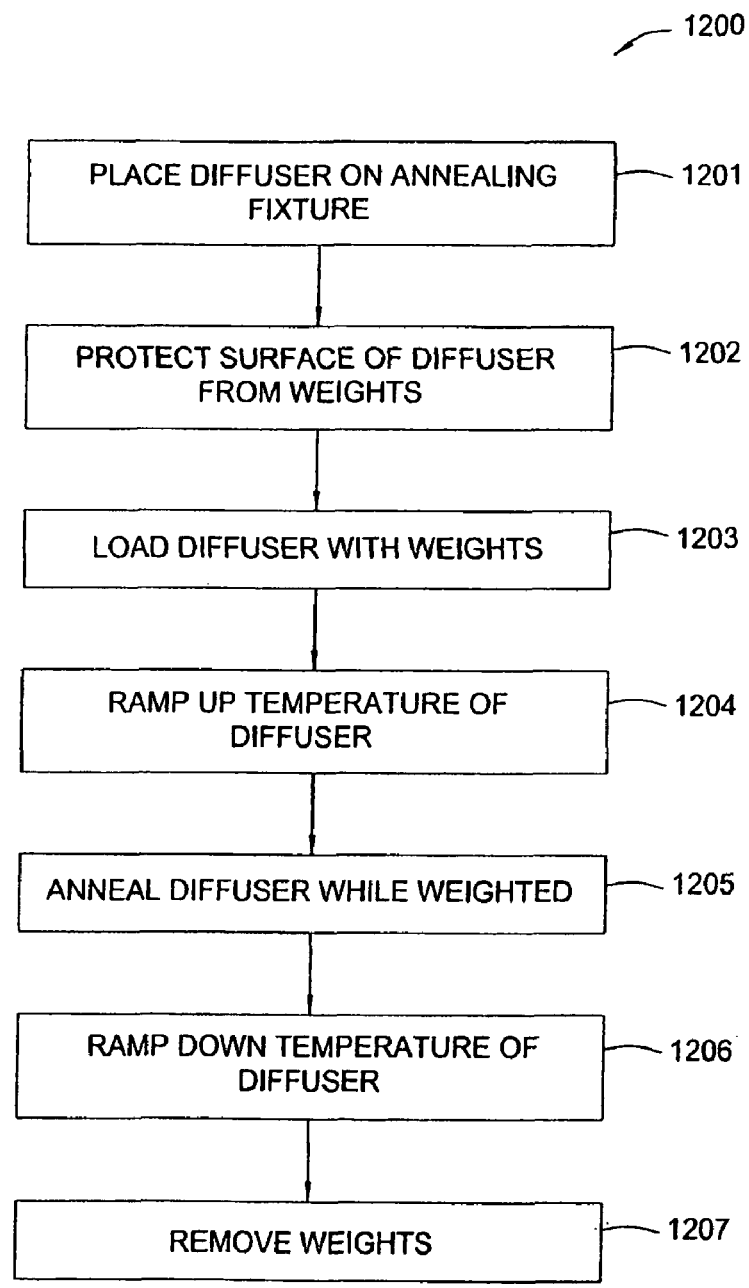
FIG. 12 illustrates a flow chart for the diffuser-annealing process for bending a diffuser plate to the desired curvature.

FIG. 12 illustrates a flow chart for the diffuser-annealing process 1200 for bending a diffuser plate to the desired curvature using a curvature annealing fixture.

Step 1201 The diffuser plate is aligned with and placed on the curvature annealing fixture. The downstream side of the diffuser should be in contact with the annealing fixture.

Step 1202 The surface of the diffuser plate is covered by a protective material to prevent damage and contamination from the annealing weights. The protective material must be clean, relatively flexible and heat-resistant. One example of protective covering that may be used is an anodized aluminum sheet.

Figure 13:
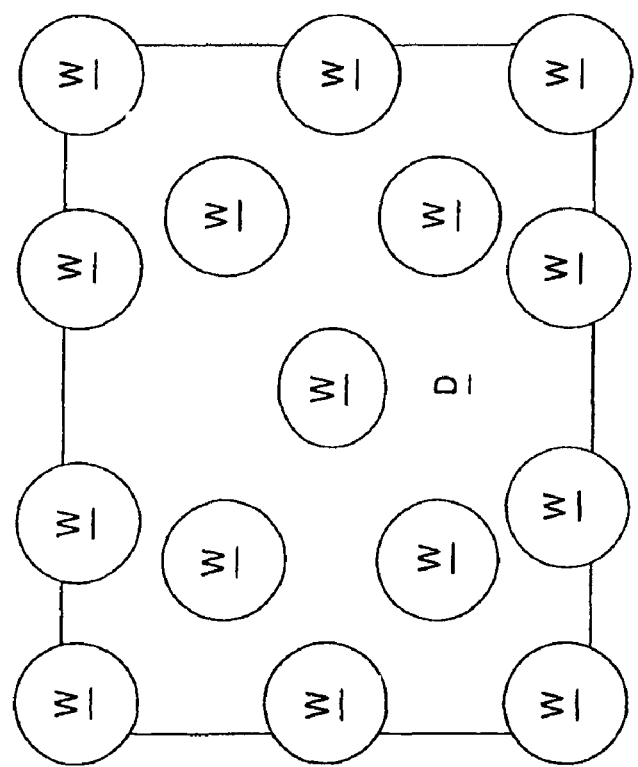
FIG. 13 illustrates an exemplary weight lay-out for annealing an aluminum diffuser plate that is 1.4 inches thick.

Step 1203 The diffuser plate is loaded with the appropriate weight required to plastically deform the diffuser during the annealing process. The weight must be distributed across the diffuser plate such that during the annealing process the diffuser plate completely conforms to the shape of the curvature annealing fixture. In general, weight should first be applied to the center point of the diffuser, then distributed along the diagonals and periphery. FIG. 13 illustrates an exemplary lay-out for weights "W" for annealing a 2200 mm×1870 mm aluminum diffuser plate "D" that is 1.44 inches thick. The amount and distribution of weight used is variable, being dependent on the size, thickness and composition of the diffuser plate, the curvature of the curvature annealing fixture, and the duration and temperature of the anneal process. However, one skilled in the art can easily determine these factors.

Step 1204 The temperature of the diffuser plate is increased to the desired anneal temperature at a rate slow enough to prevent warping. The temperature ramp rate and anneal temperature are variable since they depend on the size, thickness and composition of the diffuser plate, the curvature of the curvature annealing fixture, and the duration and temperature of the anneal process. However, one skilled in the art can easily determine these factors. In the example of the 2200 mm×1870 mm aluminum diffuser above, the appropriate temperature ramp rate is no more than about 40° C. per hour and the annealing temperature about 410° C.

Step 1205 The diffuser plate is annealed, i.e., held at the anneal temperature for the time necessary for the diffuser plate to plastically deform and conform exactly to the shape of the curvature annealing fixture. As noted above, desired anneal time is variable depending on a number of factors. This is easily determined by one skilled in the art. In the exemplary aluminum diffuser above, the anneal time is no less than about 4 hours.

Step 1206 The temperature of the diffuser plate is decreased to the room temperature at a rate slow enough to prevent warping. As stated above, this is highly variable for different diffuser plates. For the exemplary aluminum diffuser above, the cooling rate is no more than about 25° C. per hour.

Step 1207 After the diffuser plate reaches room temperature, the weights are removed.

In one aspect, the diffuser plate is not adapted with the hollow cathode gradient and the gas passages and hollow cathode cavities are substantially identical. In another aspect, the diffuser plate is adapted with both a curved downstream surface and the hollow cathode gradient. In either case, machining of the gas passages, which is greatly simplified with a substantially flat surface, is preferably performed prior to the annealing process. Although generally not as cost effective, the machining of the gas passages may also be performed after the annealing/bending process. Machining of the gas passages may be manual or numerically controlled (NC), but due to the large number of gas passages on large diffuser plates, NC machining is generally preferred.

In another embodiment, the desired curvature of the downstream side of the gas diffuser plate is formed by machining out the necessary material on the downstream side of the diffuser, using milling or lathe-type metal removal processes which are well known in the art. In one aspect, machining of the gas passages is performed prior to formation of the curved surface. In another aspect, machining of the gas passages is performed after formation of the curved surface. Machining of the gas passages may be manual or numerically controlled (NC), but due to the large number of gas passages on large diffuser plates, NC machining is generally preferred.

Figure 14A:
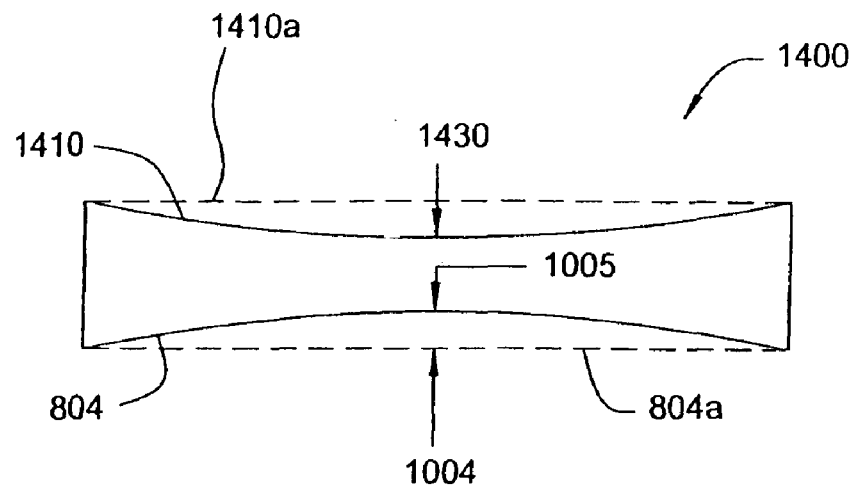
FIGS. 14A and 14B are schematic cross-sectional views of two embodiments of gas diffusion plates having curved upstream and downstream sides.
Figure 14B:
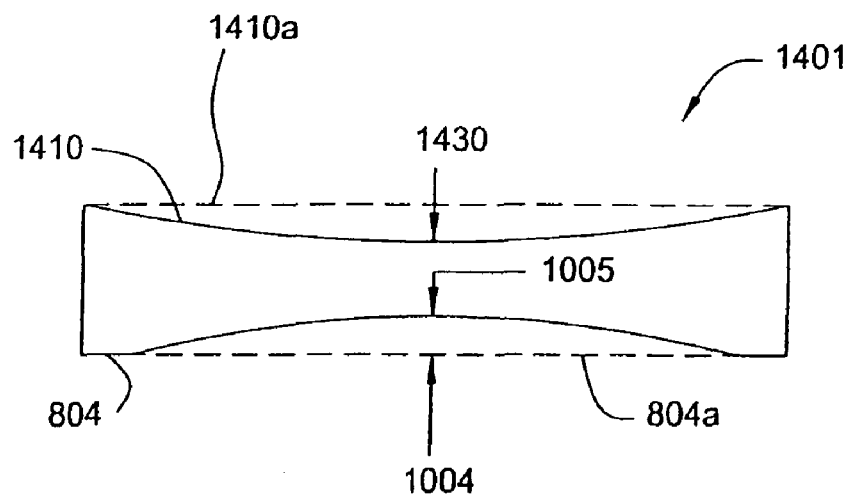

In another embodiment, gas passages are first machined into the gas diffuser plate, then a first curvature is machined into the downstream side of the gas diffuser plate, and lastly the diffuser plate is annealed into a final curvature. This embodiment provides a cost effective method for manufacturing a gas diffuser plate that includes both a hollow cathode gradient for uniformly depositing SiN and a substantially concave curvature for uniformly depositing α-Si. The typically identical gas passages are machined into a substantially flat surface. This is much more cost effective and repeatably manufactured than machining gas passages of variable depth and diameter into a curved surface. The first curvature is then machined into the downstream side of the gas diffuser plate using milling or lathe-type metal removal process which are well known in the art in order to create the desired hollow cathode cavity gradient across the surface of the diffuser; as more material is removed near the center of the diffuser plate, the resultant hollow cathode cavity size of the initially identical gas passages is reduced accordingly. The gas diffuser plate is then formed into the final desired curvature via the annealing/bending process described above, as shown in FIGS. 14A and 14B, which show schematic views of diffusion plates 1400 and 1401 analogous to the plates 1001 and 1003 of FIGS. 10 and 10B. The diffusion plates 1400 and 1401 of FIGS. 14A and 14B have concave upstream sides 1410 formed by the process of machining a first curvature in the downstream sides and the annealing or bending a final curvature in the upstream and downstream sides, as described above. This final step is necessary because the curvature required to create a desired hollow cathode gradient is rarely the same curvature desired for uniformly depositing α-Si. The diffusion plates 1400 and 1401 of FIGS. 14A and 14B have similar elements to the diffusion plates 1001 and 1003 of FIGS. 10 and 10B labeled the same. The apex 1430 of the concave upstream surface 1410 of each plate, 1400 and 1401, is located near a center region of the plate, with a distance from a hypothetical flat surface 1410a decreasing from the center region to an edge region of the plate, as described in the discussion accompanying FIGS. 10 and 10B. An embodiment similar to FIG. 10A, but having a concave upstream surface, may also be formed by the process described above.

Although several preferred embodiments which incorporate the teachings of the present invention have been shown and described in detail, those skilled in the art can readily devise many other varied embodiments that still incorporate these teachings.

While the foregoing is directed to embodiments of the present invention, other and further embodiments of the invention may be devised without departing from the basic scope thereof, and the scope thereof is determined by the claims that follow.

The invention claimed is:

1. A gas distribution plate assembly for a plasma processing chamber, comprising:
   a diffuser plate having an upstream side, a downstream side, a plurality of cathode cavities in a center region, and a plurality of cathode cavities in an edge region, wherein the downstream side has a substantially concave curvature having a maximum displacement of between about 0.1 mm and about 30 mm, and wherein surface area, volume, or density of the cathode cavities varies from the center region to the edge region.

2. The gas distribution plate assembly of claim 1, wherein the diffuser plate size is at least 1,200,000 mm$^2$.

3. The gas distribution plate assembly of claim 1, wherein the surface of the downstream side of the diffuser plate is non-anodized bare aluminum.

4. A gas distribution plate assembly for a plasma processing chamber, comprising a diffuser plate having an upstream side and a downstream side, wherein the downstream side has a substantially concave curvature, and wherein the diffuser plate comprises:
   a first gas passage formed in a center region of the diffuser plate and in fluid communication with the upstream side and the downstream side, wherein the first gas passage comprises:
      a first orifice in fluid communication with the upstream side; and
      a first hollow cathode cavity positioned substantially adjacent to the downstream side of the gas passage, the first hollow cathode cavity comprising:
         a first cathode cavity surface area;
         a first cathode cavity volume;
         a first cathode cavity flaring angle;
         a first cathode cavity depth;
         a first cathode cavity opening diameter; and
         a first cathode cavity opening coincident with the surface of the downstream side; and
   a second gas passage formed in an edge region of the diffuser plate and in fluid communication with the upstream side and the downstream side, wherein the second gas passage comprises:
      a second orifice in fluid communication with the upstream side; and
      a second hollow cathode cavity positioned substantially adjacent to the downstream side of the gas passage, the second hollow cathode cavity comprising:
         a second cathode cavity surface area;
         a second cathode cavity volume;
         a second cathode cavity flaring angle;
         a second cathode cavity depth;
         a second cathode cavity opening diameter; and
         a second cathode cavity opening coincident with the surface of the downstream side;
   wherein one or more of the cathode cavity surface area, the cathode cavity volume, the cathode cavity flaring angle, the cathode cavity depth, and the cathode cavity opening diameter increases from the first gas passage to the second gas passage, wherein the first cathode cavity depth is no less than about 0.1 inch and the second cathode cavity depth is no more than about 2.0 inch.

5. The gas distribution plate assembly of claim 4, wherein the first cathode cavity diameter is no less than about 0.1 inch and the second cathode cavity diameter is no more than about 1.0 inch.

6. The gas distribution plate assembly of claim 4, wherein the first cathode cavity flaring angle is no less than about 10 degrees and the second cathode cavity flaring angle is no more than about 50 degrees.

7. The gas distribution plate assembly of claim 4, wherein the center region further comprises:
   a plurality of gas passages in fluid communication with the upstream side and the downstream side, wherein each gas passage in the plurality of gas passages comprises:
      a cathode cavity surface area disposed on the downstream side;
      a cathode cavity volume disposed on the downstream side; and
      a first hollow cathode cavity density; and the edge region further comprises:
   a plurality of gas passages in fluid communication with the upstream side and the downstream side, wherein each gas passage in the plurality of gas passages comprises:
      a cathode cavity surface area disposed on the downstream side;
      a cathode cavity volume disposed on the downstream side; and
      a second hollow cathode cavity density.

8. The gas distribution plate assembly of claim 7, wherein the first hollow cathode cavity density is equal to the second hollow cathode cavity density and the spacing between gas passages is no more than about 0.6 inches.

9. The gas distribution plate assembly of claim 7, wherein the first hollow cathode cavity density is less than the second hollow cathode cavity density.

10. The gas distribution plate assembly of claim 4, wherein the diffuser plate is rectangular.

11. The gas distribution plate assembly of claim 4, wherein the diffuser plate size is at least 1,200,000 mm$^2$.

12. The gas distribution plate assembly of claim 7, wherein the cathode cavity surface area or the cathode cavity volume of the plurality of gas passages in the center region and edge region gradually increases in size from the center to edge of the diffuser plate.

13. The gas distribution plate assembly of claim 9, wherein the diffuser plate further comprises:
   a third region disposed between the center region and the edge region, the third region comprising a plurality of gas passages in fluid communication with the upstream side and the downstream side; and
   a third hollow cathode cavity density.

14. The gas distribution plate assembly of claim 13, wherein the first hollow cathode cavity density is no less than about 10% of the second hollow cathode cavity density.

15. The gas distribution plate assembly of claim 4, wherein the surface of the downstream side of the diffuser plate is non-anodized bare aluminum.

16. The gas distribution plate assembly of claim 1, wherein the curvature of the downstream side of the diffuser plate is described by an arc and the arc has a segment that has a circular or elliptical shape.

17. The gas distribution plate assembly of claim 1, wherein the curvature of the downstream side of the diffuser plate is described by an arc and the arc has a segment that has an exponential, second-order, third-order, sinusoidal, or hyperbolic shape.

18. A gas distribution plate assembly for a plasma processing chamber, comprising:
a diffuser plate having an upstream side, a downstream side, a diffuser plate size of at least about 1,200,000 mm$^2$, a plurality of cathode cavities in a center region, and a plurality of cathode cavities in an edge region, wherein the upstream side is substantially flat and the downstream side has a concave curvature having a maximum displacement of between about 0.01% and about 3% of the equivalent radius of the diffuser plate, and wherein a volume of the cathode cavities varies from the center region to the edge region.

19. The gas distribution plate assembly of claim 18, wherein the surface of the downstream side of the diffuser plate is non-anodized bare aluminum.

20. The gas distribution plate assembly of claim 18, wherein the cathode cavity volume gradually increases in size from the center region to the edge region of the diffuser plate.

21. The gas distribution plate assembly of claim 18, wherein the curvature of the downstream side of the diffuser plate is described by an arc and the arc has a segment that has a circular or elliptical shape.

22. The gas distribution plate assembly of claim 18, wherein the curvature of the downstream side of the diffuser plate is described by an arc and the arc has a segment that has an exponential, second-order, third-order, sinusoidal, or hyperbolic shape.

23. A gas distribution plate assembly for a plasma processing chamber, comprising:
a rectangular diffuser plate having a center region and an edge region, and a flat upstream side and a concave downstream side; and
a plurality of first cathode cavities disposed between the upstream side and the downstream side in the center region, and a plurality of second cathode cavities disposed between the upstream side and the downstream side in the edge region, each of the plurality of first cathode cavities having a first volume and each of the plurality of second cathode cavities having a second volume, wherein the first volume is different than the second volume, wherein the concave downstream side has a substantially concave curvature having a maximum displacement of between about 0.1 mm and about 30 mm.

24. The gas distribution plate assembly of claim 23, wherein the curvature of the downstream side of the diffuser plate is described by an arc and the arc has a segment that has an exponential, second-order, third-order, sinusoidal, or hyperbolic shape.

25. The gas distribution plate assembly of claim 23, wherein the curvature of the downstream side of the diffuser plate is described by an arc and the arc has a segment that has an exponential, second-order, third-order, sinusoidal, or hyperbolic shape.

26. The gas distribution plate assembly of claim 23, wherein the curvature of the downstream side of the diffuser plate is described by an arc and the arc has a segment that has a circular or elliptical shape.

27. The gas distribution plate assembly of claim 23, wherein the surface of the downstream side of the diffuser plate is non-anodized bare aluminum.

28. The gas distribution plate assembly of claim 23, wherein the second volume is greater than the first volume.

29. The gas distribution plate assembly of claim 1, wherein the upstream side has a substantially concave curvature.

30. The gas distribution plate assembly of claim 4, wherein the upstream side has a substantially concave curvature.

31. The gas distribution plate assembly of claim 7, wherein the upstream side has a substantially concave curvature.

32. The gas distribution plate assembly of claim 14, wherein the upstream side has a substantially concave curvature.

33. A gas distribution plate assembly for a plasma processing chamber, comprising a diffuser plate having an upstream side, a downstream side, a diffuser plate size of at least about 1,200,000 mm$^2$, a plurality of cathode cavities in a center region, and a plurality of cathode cavities in an edge region, wherein the upstream side has a concave curvature and the downstream side has a concave curvature having a maximum displacement of between about 0.01% and about 3% of the equivalent radius of the diffuser plate, and wherein a volume of the cathode cavities gradually increases in size from the center region to the edge region of the diffuser plate.

* * * * *

UNITED STATES PATENT AND TRADEMARK OFFICE
CERTIFICATE OF CORRECTION

PATENT NO. : 8,074,599 B2  
APPLICATION NO. : 11/173210  
DATED : December 13, 2011  
INVENTOR(S) : Choi et al.

Page 1 of 1

It is certified that error appears in the above-identified patent and that said Letters Patent is hereby corrected as shown below:

Column 14, Line 35, please delete "804 a" and insert --804a-- therefor;

Column 16, Line 14, please delete "scorn" and insert --sccm-- therefor.

Signed and Sealed this  
Twentieth Day of March, 2012

David J. Kappos  
*Director of the United States Patent and Trademark Office*